US011410850B2

(12) United States Patent
Arima et al.

(10) Patent No.: US 11,410,850 B2
(45) Date of Patent: Aug. 9, 2022

(54) ALUMINUM OXIDE SEMICONDUCTOR MANUFACTURING METHOD AND ALUMINUM OXIDE SEMICONDUCTOR MANUFACTURING DEVICE

(71) Applicant: UACJ Corporation, Tokyo (JP)

(72) Inventors: Hiroki Arima, Nagoya (JP); Koichi Ashizawa, Nagoya (JP)

(73) Assignee: UACJ CORPORATION, Tokyo (JP)

( * ) Notice: Subject to any disclaimer, the term of this patent is extended or adjusted under 35 U.S.C. 154(b) by 0 days.

(21) Appl. No.: 17/272,869

(22) PCT Filed: Aug. 30, 2019

(86) PCT No.: PCT/JP2019/034248
§ 371 (c)(1),
(2) Date: Mar. 2, 2021

(87) PCT Pub. No.: WO2020/050181
PCT Pub. Date: Mar. 12, 2020

(65) Prior Publication Data
US 2021/0272810 A1  Sep. 2, 2021

(30) Foreign Application Priority Data

Sep. 3, 2018  (JP) .............................. JP2018-164870

(51) Int. Cl.
*H01L 21/00* (2006.01)
*H01L 21/24* (2006.01)
(Continued)

(52) U.S. Cl.
CPC ............ *H01L 21/248* (2013.01); *H01L 21/40* (2013.01); *H01L 21/42* (2013.01)

(58) Field of Classification Search
CPC ............ H01L 21/479; H01L 21/02565; H01L 21/02576; H01L 21/02579; H01L 21/40; H01L 21/42
See application file for complete search history.

(56) References Cited

U.S. PATENT DOCUMENTS

2007/0178631 A1  8/2007  Tanaka
2012/0326118 A1  12/2012  Nitta
(Continued)

FOREIGN PATENT DOCUMENTS

JP  2007-235118 A  9/2007
JP  2013-008817 A  1/2013
(Continued)

OTHER PUBLICATIONS

International Search Report and Written Opinion for Application No. PCT/JP2019/034248, dated Oct. 29, 2019, 14 pages.
(Continued)

*Primary Examiner* — Reema Patel
(74) *Attorney, Agent, or Firm* — McCarter & English, LLP; David G. Conlin; Nathan D. Harrison

(57) ABSTRACT

A semiconductor manufacturing method by a semiconductor manufacturing device includes: positioning an anode, which causes an oxidation reaction, in a first end of a base material containing an aluminum oxide and a cathode, which causes a reduction reaction, in a second end of the base material; heating the base material to melt it with the anode being in contact with the first end of the base material and the cathode being in contact with the second end of the base material; causing a current to flow between the anode and the cathode to cause a molten salt electrolysis reaction for a whole of or a part of a period in which the base material is at least partially melted; and after the molten salt electrolysis reaction, cooling the base material to form a p-type aluminum oxide semiconductor layer and an n-type aluminum oxide semiconductor layer.

7 Claims, 12 Drawing Sheets

FIG. 7

(51) Int. Cl.
  H01L 21/40   (2006.01)
  H01L 21/42   (2006.01)

(56) References Cited

U.S. PATENT DOCUMENTS

| | | |
|---|---|---|
| 2014/0217471 A1 | 8/2014 | Sasaki et al. |
| 2015/0194479 A1 | 7/2015 | Kaneko et al. |
| 2016/0312377 A1 | 10/2016 | Bruck et al. |
| 2020/0135494 A1 * | 4/2020 | Ashizawa ............. H01L 29/861 |

FOREIGN PATENT DOCUMENTS

| | | |
|---|---|---|
| JP | 5343224 B1 | 11/2013 |
| JP | 2016-143841 A | 8/2016 |
| WO | 2013/035844 A1 | 3/2013 |
| WO | 2016/175251 A1 | 11/2016 |
| WO | WO2018225855 A1 * | 12/2018 ........... H01L 29/868 |

OTHER PUBLICATIONS

International Preliminary Report on Patentability for Application No. PCT/JP2019/034248, dated Mar. 18, 2021, 8 pages.
European Office Action for Application No. 19858379.1, dated Apr. 28, 2022, 6 pages.

* cited by examiner

FIG. 18

| EXAMPLE / COMPARATIVE EXAMPLE | HIGH VOLTAGE APPLICATION | LASER TYPE | LASER EMISSION | BORING OF BASE MATERIAL 1 | CURRENT FOR ELECTROLYSIS | PREPARED SAMPLE ||| 
|---|---|---|---|---|---|---|---|---|
| | | | | | | SIZE ($\mu m$) | RESULT OF ELEMENTAL ANALYSIS ON SURFACE | SEMICONDUCTOR PROPERTY |
| EXAMPLE 1 | NOT APPLIED | DISK LASER | 500W × WHOLE OF 500ms FOCAL POINT SHIFTING: ±0mm | BORED | APPLIED | ABOUT 1200 | ANODE (Al) SIDE: OXYGEN-DEFICIENT AMORPHOUS ALUMINUM OXIDE CATHODE (Pt) SIDE: OXYGEN-EXCESS AMORPHOUS ALUMINUM OXIDE | ANODE SIDE: n-TYPE SEMICONDUCTOR CATHODE SIDE: p-TYPE SEMICONDUCTOR |
| EXAMPLE 2 | NOT APPLIED | CARBON DIOXIDE LASER | 100mJ × WHOLE OF 500ms FOCAL POINT SHIFTING: 4.0mm | NOT BORED | APPLIED | ABOUT 700 | ANODE (Al) SIDE: OXYGEN-DEFICIENT AMORPHOUS ALUMINUM OXIDE CATHODE (Pt) SIDE: OXYGEN-EXCESS AMORPHOUS ALUMINUM OXIDE | ANODE SIDE: n-TYPE SEMICONDUCTOR CATHODE SIDE: p-TYPE SEMICONDUCTOR |
| COMPARATIVE EXAMPLE 1 | NOT APPLIED | DISK LASER | 500W × WHOLE OF 500ms FOCAL POINT SHIFTING: ±0mm | BORED | NOT APPLIED | ABOUT 200 | ANODE SIDE: NOT CHANGED FROM ALUMINUM OXIDE CATHODE SIDE: NOT CHANGED FROM ALUMINUM OXIDE | COULD NOT ATTAIN SEMICONDUCTOR PROPERTY |
| COMPARATIVE EXAMPLE 2 | 20V × 300ns | — | NOT APPLIED | NOT BORED | APPLIED | ABOUT 1 VERY SMALL | ANODE (Al) SIDE: OXYGEN-DEFICIENT AMORPHOUS ALUMINUM OXIDE CATHODE (PROBE) SIDE: OXYGEN-EXCESS AMORPHOUS ALUMINUM OXIDE | ANODE SIDE: n-TYPE SEMICONDUCTOR CATHODE SIDE: p-TYPE SEMICONDUCTOR |

ALUMINUM OXIDE SEMICONDUCTOR MANUFACTURING METHOD AND ALUMINUM OXIDE SEMICONDUCTOR MANUFACTURING DEVICE

TECHNICAL FIELD

The present invention relates to a semiconductor manufacturing method and a semiconductor manufacturing device.

BACKGROUND ART

Heretofore, in the field of semiconductors, particularly in the field of power semiconductor, the semiconductors have been required to have higher power, to have a higher withstanding voltage, to be operable at a high temperature, and to be operable at a higher frequency. Among these, achievement of the higher withstanding voltage is particularly important. Accordingly, in the field of power semiconductors, a wide band gap semiconductor, which has a wider band gap than that of a conventional Si-based semiconductor, is desired. Also in the field of semiconductor batteries serving as primary batteries or secondary batteries, the emergence of a semiconductor negative electrode material and a semiconductor positive electrode material that can increase an electromotive force and a power storage amount of the semiconductor battery is expected.

Here, silicon (Si) has a band gap of 1.1 eV. In contrast, silicon carbide (SiC) and gallium nitride (GaN), each of which is an example of the wide band gap semiconductor, have band gaps of 3.3 eV and 3.4 eV, respectively.

Recently, a wide band gap semiconductor having a wider band gap is under development. For example, diamond (C), which has a band gap of 5.5 eV, attracts an attention as a material of the wide band gap semiconductor. However, diamond itself is not a semiconductor, and therefore it is necessary to perform ion implantation in diamond to form a donor level or an acceptor level. The ion implantation in diamond needs to be performed at a high temperature and a high pressure, and therefore cannot be performed easily, disadvantageously.

Meanwhile, an aluminum oxide has a band gap of 8.8 eV. Thus, if the aluminum oxide can be used as a material of the wide band gap semiconductor, this would be attractive. However, it has been difficult so far to form a donor level or an acceptor level in the band gap of the aluminum oxide. In particular, the acceptor level, which is necessary to form a p-type semiconductor from the aluminum oxide, has been difficult to form. Under these circumstances, it has been difficult to form a p-type semiconductor from the aluminum oxide and to form a pn junction from the aluminum oxide, although the aluminum oxide is deemed to be highly reliable as a quite excellent insulator.

In view of this, as described in Patent Literature 1, the inventors of the present invention examined a semiconductor layer containing an aluminum oxide as a base material and a method for manufacturing the semiconductor layer.

CITATION LIST

Patent Literature

[Patent Literature 1]
International Publication No. 2016/175251

SUMMARY OF INVENTION

Technical Problem

After making the invention described in Patent Literature 1, the inventors of the present invention conducted a further examination, so as to attain the following result. That is, by applying a high voltage of approximately 10 V to 60 V between the anode and the cathode so as to cause a spark, it is possible to manufacture a semiconductor layer from an aluminum oxide and an element including a pn junction formed in the semiconductor layer.

However, the semiconductor layer actually manufactured by a spark had a size of approximately 1 μm (more specifically, 0.5 μm to 2 μm), which was too small to be practically used as an element.

In order to deal with this, the inventors of the present invention caused a spark plural times by a scanning technique, and succeeded in increasing the size of a semiconductor obtained by a spark.

According to this method, however, the resulting product had different semiconductor characteristics at different spark points, and therefore the product as a whole could not attain a stable semiconductor characteristic.

The inventors of the present invention made another attempt to create a larger semiconductor layer by using a manual prober attached with a probe whose tip is approximately 20 μm in diameter. In this attempt, an area of an aluminum oxide that actually contributed to formation of a semiconductor layer was small, and a product actually obtained had a size of approximately 5 μm. The semiconductor layer thus formed could not attain a sufficient size enabling practical application of the semiconductor layer, and electric properties of the semiconductor layer could not be measured.

In order to determine electric properties of a semiconductor layer by, e.g., Hall effect measurement, it is necessary to form the semiconductor layer so as to have a size of approximately 20 μm or more and to minutely fabricate four terminals on the semiconductor layer. In addition, in order to bring a semiconductor layer into practical application, the semiconductor layer needs to be formed to be greater than 1 mm. Thus, it is technically difficult to increase the size of a semiconductor layer containing an aluminum oxide as a base material, disadvantageously.

In view of the circumstances described above, the present invention was made. An object of the present invention is to provide a semiconductor manufacturing method and a semiconductor manufacturing device that can yield a large semiconductor layer containing an aluminum oxide as a base material.

Solution to Problem

A semiconductor manufacturing method in accordance with an embodiment of the present invention made to attain the above object includes the steps of: (a) positioning an anode in a first end of a base material and a cathode in a second end of the base material, the base material containing an aluminum oxide, the anode causing an oxidation reaction, the cathode causing a reduction reaction; (b) heating the base material to melt the base material in a state where the anode is in contact with the first end of the base material and the cathode is in contact with the second end of the base material; (c) causing a current to flow between the anode and the cathode to cause a molten salt electrolysis reaction for a whole of or a part of a period in which the base material is at least partially melted; and after the step (c), (d) cooling the base material to form a p-type aluminum oxide semiconductor layer and/or an n-type aluminum oxide semiconductor layer.

Advantageous Effects of Invention

According to the present invention, it is possible to increase the size of a semiconductor layer containing an aluminum oxide as a base material.

BRIEF DESCRIPTION OF DRAWINGS

FIG. 18 shows Examples 1 and 2 as well as Comparative Examples 1 and 2.

DESCRIPTION OF EMBODIMENTS

Embodiment 1

A semiconductor manufacturing method and a semiconductor manufacturing device in accordance with Embodiment 1 of the present invention are described below with reference to FIGS. 1 to 8. For convenience of explanation, parts having identical features in the embodiments are given identical reference signs, and parts that are given identical reference signs are not repeatedly described as appropriate.

[Raw Materials]

Embodiment 1 adopts an aluminum oxide as a base material 1, which is a raw material used to form a semiconductor layer by a laser technique. The material of the base material 1 is not limited to so-called "alumina", but may alternatively be single-crystal sapphire having a melting point of 2040° C., a noncrystalline (amorphous) material, or a polycrystalline material. The base material 1 is plate-shaped. However, this is not limitative. Alternatively, the base material 1 may be bar-shaped, line-shaped, or powdery, for example. The aluminum oxide used as the base material 1 preferably has a high purity. However, the purity of the aluminum oxide may be relatively low. For example, the base material 1 may be an aluminum oxide having a purity of 99.4% or more or 4N sapphire.

[Semiconductor Manufacturing Device]

Figure 1:
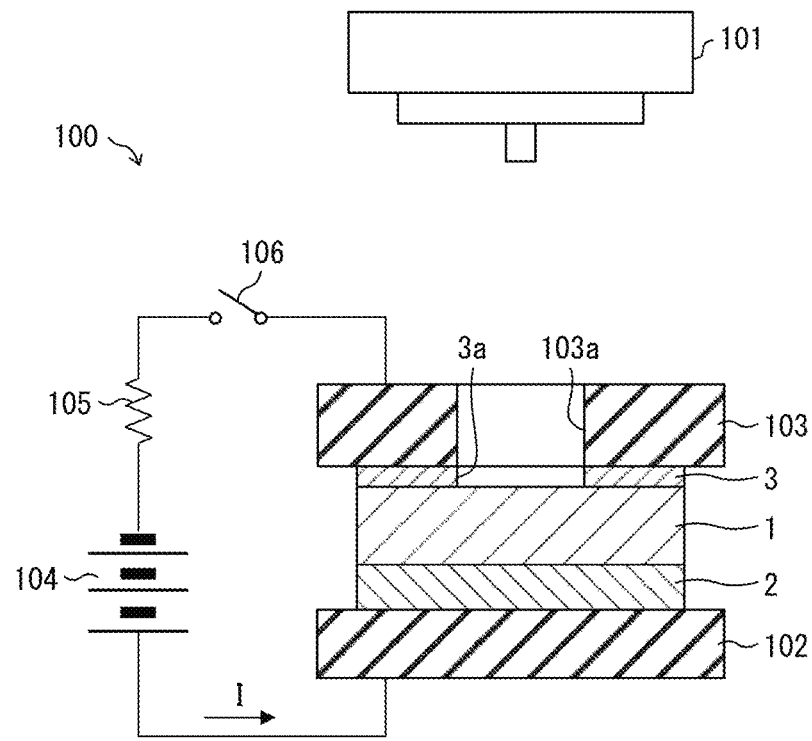
FIG. 1 is a view illustrating arrangement of a semiconductor manufacturing device and a cell in accordance with Embodiment 1.

As shown in FIG. 1, a semiconductor manufacturing device 100 in accordance with Embodiment 1 includes: a pressure plate 102 and a perforated pressure plate 103 having a through-hole 103a, which are jigs for bringing an anode 2 and a cathode 3 (described later) into contact with the base material 1; a laser device 101 serving as a light source for emitting a laser beam to the base material 1; a direct-current power source 104 for controlling a voltage that is to be applied between the anode 2 and the cathode 3; a current limiting resistor 105 for limiting a current flowing between the anode 2 and the cathode 3; and a switch 106.

The anode 2 is positioned close to a first side (a lower side in FIG. 1) of the base material 1. The cathode 3 is positioned close to a second side (an upper side in FIG. 1) of the base material 1. The pressure plate 102 and the perforated pressure plate 103 are plate-shaped jigs respectively configured to bring the anode 2 and the cathode 3 into contact with the base material 1.

[Anode]

The anode 2 may be aluminum, for example. The anode 2 is plate-shaped. Alternatively, the anode 2 may be powdery, for example. The shape of the anode 2 may be changed as needed. The aluminum oxide has a melting point of 2072° C. Thus, when the base material 1 is melted, aluminum (melting point: 660° C.) that is in contact with the base material 1 is at least partially melted. Consequently, a gap between the base material 1 and the anode 2 tends to disappear. As a result of disappearance of the gap, a contact area between the base material 1 and the anode 2 increases. This can reduce anode polarization in the base material 1 that might be caused by a molten salt electrolysis reaction.

In a case of using an aluminum plate as the anode 2, it is preferable that the aluminum plate be a thin plate having a thickness of 0.01 mm to 10 mm so that the semiconductor manufacturing device 100 has a light weight as a whole. However, it is more preferable that the anode 2 have a thickness of 1 mm or more in order to prevent a phenomenon that the anode 2 is entirely melted and its structure is broken.

The aluminum plate used as the anode 2 preferably has a high aluminum purity. However, the anode 2 may be an aluminum alloy containing another element, such as 1085 aluminum (99.85 mass % aluminum and other elements, e.g., Fe, Si).

Note that there is no limitation on a direction of laser emission from the laser device 101 to the base material 1. In a case where a laser beam is emitted in a direction from the anode 2 to the base material 1 unlike the case shown in FIG. 1, the laser beam first hits the anode 2. Thus, as a result of emission of the laser beam, the anode 2 is broken or melted. Thereafter, the heat of the laser beam reaches the base material 1. In the case where the laser beam is to be emitted in this direction, a small hole may be formed in the anode 2 in advance, and the base material 1 may be directly subjected to a laser beam via the small hole.

[Cathode]

The cathode 3 may be a platinum plate, for example. In the cathode 3, a reaction of reducing oxygen ($O_2$) into oxygen ions ($O^{2-}$) occurs. As the cathode 3, other various materials may be used. For example, the cathode 3 may be (1) a platinum group metal such as rhodium, (2) a platinum group oxide such as an iridium oxide, a palladium oxide, or a ruthenium oxide, or (3) a platinum group compound. Alternatively, the cathode 3 may be (1) an alloy containing the above-described platinum group metal, platinum group oxide, or platinum group compound or (2) a mixture containing the above-described platinum group metal, platinum group oxide, or platinum group compound. Further alternatively, the cathode 3 may be carbon.

Among these, platinum (melting point: 1768° C.) is excellent when used as the cathode 3. Platinum having a higher purity is preferable. However, considering the purpose of use of the cathode 3, platinum having a purity (99.9%) of commercially-available ones can sufficiently function as the cathode 3. When the base material 1 is melted, platinum may possibly be melted at a portion where platinum and the base material 1 are in contact with each other. In such a case, a gap between the base material 1 and the cathode 3 tends to disappear. As a result of disappearance of the gap, a contact area between the base material 1 and the cathode 3 increases. This can reduce anode polarization in the base material 1 that might be caused by a molten salt electrolysis reaction.

Similarly to the anode 2, there is no limitation on a direction of laser emission from the laser device 101 to the base material 1. For example, in a case where a laser beam is emitted in a direction from the cathode 3 to the base material 1, the laser beam first hits the cathode 3. Thus, as a result of emission of the laser beam, the cathode 3 is broken or melted. Thereafter, the heat of the laser beam reaches the base material 1. Typically, in a state where a surface of the base material 1 is exposed via a small hole 3a formed in the cathode 3 in advance, the base material 1 directly receives, via the small hole 3a, a laser beam emitted from the laser device 101.

Forming the small hole 3a in the cathode 3 brings about the following advantage. That is, in response to laser emission, the base material 1 is melted and a molten salt electrolysis reaction occurs. This reaction is a cathode reaction in which oxygen existing on a surface of the cathode 3 is reduced into $O^{2-}$. This cathode reaction is considered to occur at a triple phase boundary between the molten salt (aluminum oxide), the cathode (platinum in a solid state or a liquid state), and the oxidant (oxygen gas). Here, at a contact point between the cathode 3 and the base material 1, oxygen is required as a reaction species. Oxygen used as the reaction species may be oxygen in the air. Alternatively, oxygen used as the reaction species may be an oxygen gas or an oxygen-mixed gas. In order that the molten salt electrolysis reaction takes place smoothly, the cathode 3 requires a space for accumulating an oxygen gas or the like at a location close to the cathode 3. In order to meet this, the cathode 3 having the small hole 3a may be provided. With this, the above-described space can be secured.

Here, platinum has a melting point of 1768° C., which is lower than a melting point of 2072° C. of an aluminum oxide. Thus, when the base material 1 is melted in response to laser emission, a portion of the cathode 3 which portion is in contact with the base material 1 is considered to be melted even in a short laser emission period. If the cathode 3 is melted for long time, this may possibly cause breakdown of the structure functioning as the cathode 3. In order to avoid breakdown of the structure functioning as the cathode 3, it is necessary to set an appropriate laser emission condition(s).

[Laser Device]

The laser device 101 is a device for emitting a laser beam to the base material 1. The laser beam emitted by the laser device 101 may be a laser beam emitted by a disk laser (wavelength: 1030 nm), a laser beam emitted by a fiber laser (wavelength: 1064 nm), a laser beam emitted by a yttrium aluminum garnet (YAG) laser (wavelength: 1064 nm), a laser beam emitted by an excimer laser (the wavelength thereof varies depending on the type of gas used as a laser medium, and may be 193248 nm or 308351 nm, for example), a laser beam emitted by a carbon dioxide laser (wavelength: 1.6 μm), or a laser beam emitted by a semiconductor laser (the wavelength thereof varies depending on the element(s) from which the semiconductor is made, and may be within a range of 375 nm to 2000 nm, for example). The laser technique used in Embodiment 1 preferably employs any of the lasers described above. Among these, the disk laser, the fiber laser, or the carbon dioxide laser is suitable for an experiment of forming an aluminum oxide semiconductor layer.

[Method for Emitting Laser Beam to Sample]

Typically, the laser emission condition(s) of the laser device 101 can be finely adjusted. Specifically, it is possible to appropriately set a laser emission output (W), a spot size (mmφ), an emission period (ms), a focal point shifting amount (mm), and/or the like. A light beam emitted from the disk laser, the fiber laser, or the like has a wavelength of approximately 1000 nm, which is within an infrared region. Thus, in principle, the light beam from such a laser would pass through the base material 1 and cannot perform processing.

Actually, however, the base material 1 has unevenness and/or dirt on its surface, and therefore the heat of the laser beam is absorbed into some parts. In some cases, the parts may serve as starting points from which the heat is transmitted to their surroundings, so as to enable target processing (in Embodiment 1, melting of the base material 1). Here, in order to perform the processing in a stable manner, it is preferable to reliably secure the heat-absorbing parts by applying a quite small amount of graphite powder on a surface of the base material 1 in advance.

Typically, the laser device 101 performs laser emission on a single base material 1 plural times. The position to be subjected to the laser emission is generally programmed in advance. The position to be subjected to the laser emission may be determined by a galvano scanner including a mirror in a state where the base material 1 is fixed. Alternatively, the position may be determined by moving the base material 1 over an XYZ stage in a state where the laser device 101 is fixed. Further alternatively, the position may be determined by a combination of these techniques.

[Cell to be Subjected to Laser Emission]

As shown in FIG. 1, the pressure plate 102 having an electroconductivity, the anode 2, the base material 1, the cathode 3, and the perforated pressure plate 103 having an electroconductivity are stacked in this order. The stacked structure is called "cell".

At the time of laser emission, it is important that the small hole 3$a$ of the cathode 3 is aligned with the through-hole 103$a$ of the perforated pressure plate 103. The pressure plate 102 and the perforated pressure plate 103 are fixed with loads being applied thereto with clamps. The pressure plate 102 and the clamp that applies the load thereto should be insulated from each other with an insulating sheet or the like placed between the pressure plate 102 and the clamp. Similarly, the perforated pressure plate 103 and the clamp that applies the load thereto should be insulated from each other with an insulating sheet or the like placed between the perforated pressure plate 103 and the clamp.

The direct-current power source 104 is configured to apply a voltage to the above-described cell. The direct-current power source 104 has a positive side connected to the pressure plate 102 and a negative side connected to the perforated pressure plate 103. In Embodiment 1, the current limiting resistor 105 and the switch 106 are disposed between the negative side of the direct-current power source 104 and the perforated pressure plate 103, as shown in FIG. 1. The switch 106 may be manually turned ON or OFF. Alternatively, in order to allow a current I to flow automatically when a molten salt electrolysis reaction occurs in response to laser emission, the switch 106 may be configured to be turned ON/OFF in sync with emission of a laser beam or to be turned ON before laser emission is performed.

[Semiconductor Manufacturing Method]

Next, a method for manufacturing a semiconductor layer by use of the semiconductor manufacturing device 100 is described with reference to FIGS. 1 to 9. Assume that the works for this method are performed while the semiconductor manufacturing device 100 is under the atmosphere, i.e., in the air, and at a room temperature.

First, this method positions an anode 2 on a lower surface of a base material 1 and positions a cathode 3 on an upper surface of the base material 1, the lower surface being a first principle surface of the base material 1, the upper surface being a second principle surface of the base material 1 and facing the lower surface (positioning step S1).

Next, this method heats the base material 1 to a temperature equal to or higher than a melting point (2072° C.) of the base material 1 to melt the base material 1, in a state where the anode 2 and the cathode 3 are in contact with the base material 1 (heating step S2). Heating of the base material 1 is performed by emission of a laser beam from the laser device 101 toward the base material 1, as shown in FIG. 5.

The following provides a specific explanation of the heating step S2. In the heating step S2, the switch 106 is first turned ON so that a voltage is applied between the anode 2 and the cathode 3. Note that, immediately after the voltage is applied between the anode 2 and the cathode 3, a current I would not flow through the base material 1, which is an insulator.

A magnitude of the voltage to be applied varies depending on the constituent materials of the above-described cell or the laser emission condition(s), but is to be set to fall within a range of 1 V to 60 V. In Embodiment 1, for the purpose of suppressing or reducing an increase in speed of the molten salt electrolysis reaction, the current limiting resistor 105 is disposed in series to the direct-current power source 104 to prevent flowing of a current I of a certain value or higher. Thus, a coulomb amount in the current I flowing between the anode 2 and the cathode 3 is regulated.

Figure 5:
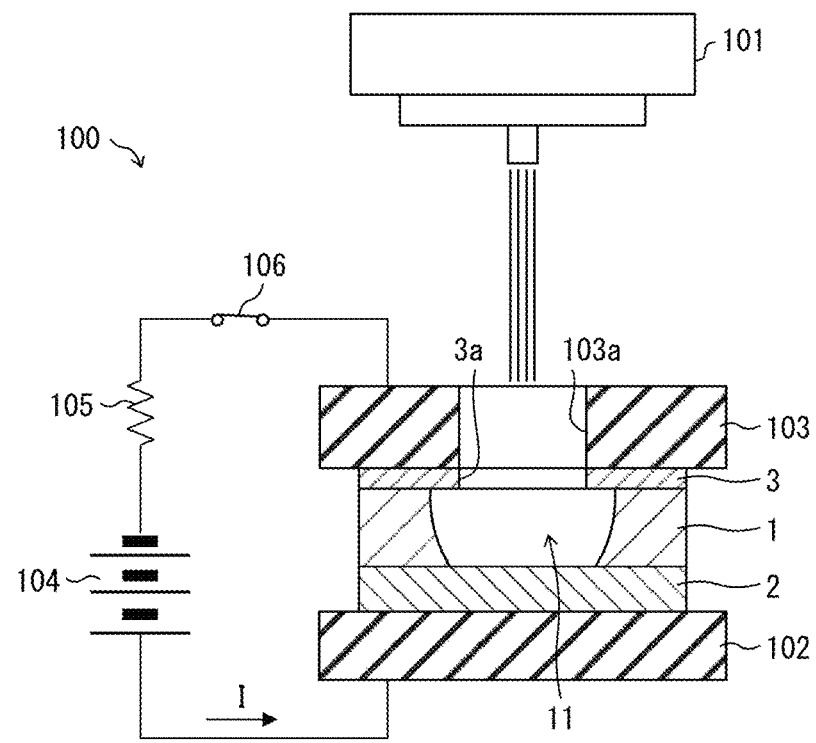
FIG. 5 is a view illustrating a method for forming an aluminum oxide semiconductor layer by laser emission in accordance with Embodiment 1.

Then, as shown in FIG. 5, the laser device 101 emits a laser beam toward the perforated pressure plate 103. Through the through-hole 103$a$ of the perforated pressure plate 103 and the small hole 3$a$ of the cathode 3, the laser beam from the laser device 101 is emitted to the base material 1.

Figure 6:
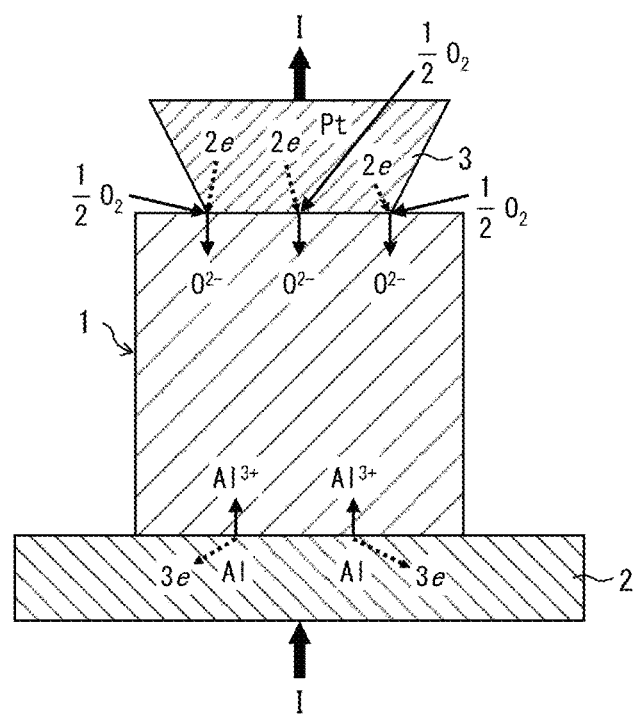
FIG. 6 is a view illustrating a state in accordance with Embodiment 1 in which a molten salt electrolysis reaction occurs in a base material and a temperature is equal to or higher than a melting point of the base material.

After the heating step S2, this method causes the current I to flow between the anode 2 and the cathode 2 to cause a molten salt electrolysis reaction for the whole of a period in which the base material 1 is at least partially melted, as shown in FIG. 6 (molten salt electrolysis reaction step S3). The molten salt electrolysis reaction occurs at a boundary between the base material 1 and the anode 2 and at a boundary between the base material 1 and the cathode 3. The period of performing the molten salt electrolysis reaction step S3 may be only a part of the period in which the base material 1 is at least partially melted.

In the molten salt electrolysis reaction step S3, the base material 1 is heated to a temperature equal to or higher than the melting point, so as to be melted. The heat is transmitted from the base material 1 to the anode 2 and to the cathode 3. The heat transmitted to the anode 2 from the base material 1 melts a part of the surface of the aluminum plate that serves as the anode 2. The melted surface of the base material 1 and the melted surface of the anode 2 come into close contact with each other. At the boundary between the melted surface of the base material 1 and the melted surface of the anode 2, an anode reaction advances.

Meanwhile, the heat transmitted from the base material 1 to the cathode 3 may sometimes melt a part of the surface of the platinum plate that serves as the cathode 3. Here, the melted surface of the base material 1 and the melted surface of the cathode 3 come into close contact with each other. Oxygen in the air is supplied to the boundary between the melted surface of the base material 1 and the melted surface of the cathode 3, so that a cathode reaction advances in the boundary.

Figure 8:
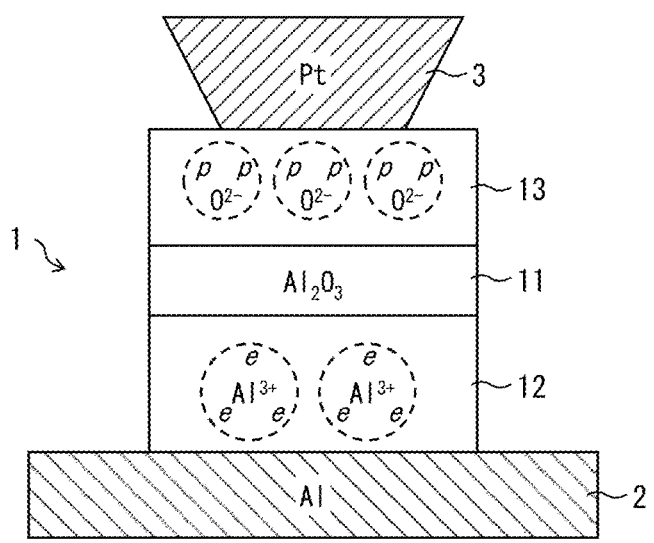
FIG. 8 is a view illustrating a state in accordance with Embodiment 1 in which the semiconductor layer is being formed and a temperature is close to a room temperature.

After the molten salt electrolysis reaction step S3 described above, this method cools the base material 1 to form an n-type semiconductor layer 12 and a p-type semiconductor 13 (semiconductor layer forming step S4). Specifically, in the semiconductor layer forming step S4, the laser emission by the laser device 101 ends. When the laser emission ends, the temperature of the base material 1 decreases, and consequently the base material 1 is partially condensed and turned into a solid. As a result, as shown in FIG. 8, the n-type semiconductor layer 12 (n-type aluminum oxide semiconductor layer) that is in a state where oxygen is deficient or a state where aluminum is excess is formed in the anode 2. Meanwhile, the p-type semiconductor 13 (p-type aluminum oxide semiconductor layer) that is in a state where oxygen is excess or a state where aluminum oxide is deficient is formed in the cathode 3.

The thicknesses of the n-type semiconductor layer 12 and p-type semiconductor 13 obtained by the semiconductor manufacturing method in accordance with Embodiment 1 can be changed by, e.g., the thickness of the base material 1, the laser emission condition(s), and/or the coulomb amount (current×time) in the current I flowing between the anode 2 and the cathode 3. For example, assume that a base material 1 with a thickness of 0.5 mm is used. Each of an n-type semiconductor layer 12 and a p-type semiconductor 13 formed in this case has a thickness in a wide range of 5 μm to 250 μm. In addition, by adjusting the electrolysis condition(s) for the molten electrolysis reaction, it is possible to form a pn junction in which the n-type semiconductor layer 12 and the p-type semiconductor 13 are in surface contact with each other. However, the molten salt in a liquid state may change its form greatly due to its flowing movement. Thus, the n-type semiconductor layer 12 and the p-type semiconductor 13 may possibly not be produced in the form of distinct layers. That is, a layer in which an n-type semiconductor, a p-type semiconductor, an aluminum oxide, and a metallic aluminum are mixed or a layer in which two or three of an n-type semiconductor, a p-type semiconductor, an aluminum oxide, and a metallic aluminum are mixed may be formed.

Figure 2:
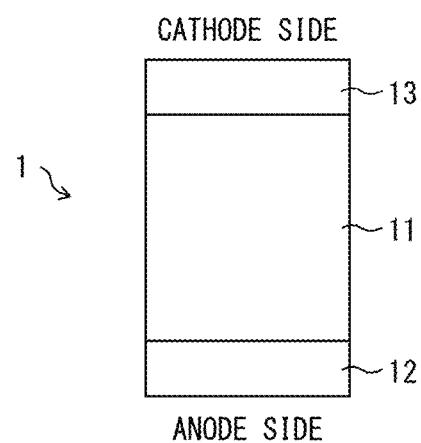
FIG. 2 is a view illustrating a semiconductor layer in accordance with Embodiment 1, the semiconductor layer being formed as a result of application of a current with a small coulomb amount.
Figure 3:
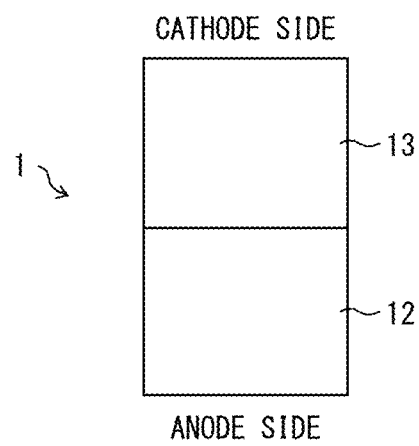
FIG. 3 is a view illustrating a semiconductor layer in accordance with Embodiment 1, the semiconductor layer including a pn junction formed therein.
Figure 4:
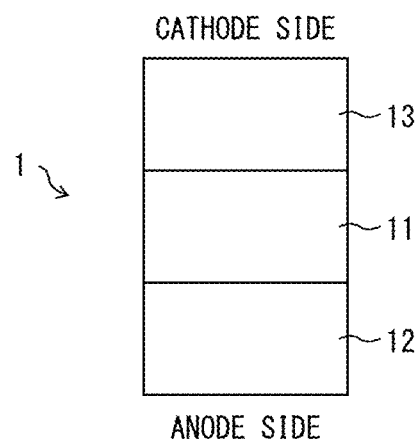
FIG. 4 is a view illustrating a semiconductor layer in accordance with Embodiment 1, the semiconductor layer being formed as a result of application of a current with a large coulomb amount.

Each of FIGS. 2 to 4 shows an n-type semiconductor layer 12 and a p-type semiconductor 13 formed by causing a molten salt electrolysis reaction while a coulomb amount in a current I flowing between an anode 2 and a cathode 3 is appropriately changed and thereafter cooling the resultant to a room temperature. Each of FIGS. 2 to 4 shows a case where the molten salt does not change its form due to flowing movement and the n-type semiconductor layer 12 and the p-type semiconductor 13 are produced in the form of distinct layers. FIG. 2 shows a case where the coulomb amount in the current I is small. On the anode 2 side, the n-type semiconductor layer 12 is formed. On the cathode 3 side, the p-type semiconductor layer 13 is formed. In addition, an aluminum oxide layer 11 exists between the n-type semiconductor layer 12 and the p-type semiconductor layer 13. Since the aluminum oxide layer 11 is an insulator at a room temperature, it is impossible to achieve a semiconductor device.

FIG. 3 shows a case where the coulomb amount in the current I is greater than that in the case shown in FIG. 2 and a pn junction is formed. On the anode 2 side, the n-type semiconductor layer 12 is formed. On the cathode 3 side, the p-type semiconductor layer 13 is formed. The n-type semiconductor layer 12 and the p-type semiconductor layer 13 are in contact with each other via a single boundary so as to form a pn junction. Consequently, a pn diode is formed. That is, in the case of FIG. 3, it is possible to achieve a semiconductor device.

FIG. 3 shows an ideal pn junction surface in which a reaction surface of the cathode 3 and a reaction surface of the anode 2 are in parallel with each other. Actually, however, the molten salt changes its form due to its flowing movement, as described above. In this case, the reaction surface of the cathode 3 and the reaction surface of the anode 2 may not be in parallel with each other and/or a cathode reaction rate and an anode reaction rate may not be uniform, and consequently an ideal pn junction surface cannot be attained. This may lead to a state where a pn junction surface and a junction surface in which a pn junction is not formed but an aluminum oxide is formed coexist. Although the product with a small pn junction surface can function as a semiconductor device, such a semiconductor device cannot attain a uniform device characteristic.

FIG. 4 shows a case where the coulomb amount in the current I is greater than that in the case shown in FIG. 3. The greater the coulomb amount in the current I, the greater the thicknesses of the p-type semiconductor layer 13 and the n-type semiconductor layer 12. In this case, when a p-type semiconductor layer 13 and an n-type semiconductor layer 12 are mixed together, an aluminum oxide layer 11 that is melted is formed. The aluminum oxide melted at a high temperature is ionized, and therefore has ionic conductivity. However, when the aluminum oxide is cooled to a room temperature, the aluminum oxide becomes an insulative aluminum oxide. Therefore, similarly to the configuration shown in FIG. 2, the configuration shown in FIG. 4 cannot provide a semiconductor device.

In Embodiment 1, in order to achieve a pn junction diode, a pn junction as those shown in FIG. 3 may be formed. However, without an ideal pn junction as those shown in the example in FIG. 3, it is difficult to manufacture a high-quality pn junction diode having a stable characteristic, for the reason described above.

The p-type semiconductor layer 13 and the n-type semiconductor layer 12 produced in Embodiment 1 can be used as raw materials of an aluminum oxide semiconductor device and an aluminum oxide semiconductor battery.

Referring back to FIG. 9, the following describes a manufacturing procedure performed after the semiconductor layer forming step S4. In Embodiment 1, a separating step S5 is performed after the semiconductor layer forming step S4. In the separating step S5, the loads applied to the pressure plate 102 and the perforated pressure plate 103 are first eliminated, and then only the n-type semiconductor layer 12 and the p-type semiconductor layer 13, which are interposed between the anode 2 and the cathode 3, are removed from the semiconductor manufacturing device 100. Then, the n-type semiconductor layer 12 and the p-type semiconductor layer 13 are separated from each other by cutting or sputtering, for example. The separation by sputtering is performed in the following manner. That is, in order to separate the n-type semiconductor layer 12, sputtering is performed with the p-type semiconductor layer 13 being masked. Meanwhile, in order to separate the p-type semiconductor layer 13, sputtering is performed with the n-type semiconductor layer 12 being masked.

The n-type semiconductor layer 12 and the p-type semiconductor layer 13 thus separated are taken out. Then, the n-type semiconductor layer 12 can be used as a raw material of an n-type aluminum oxide semiconductor, and the p-type semiconductor layer 13 can be used as a raw material of a p-type aluminum oxide semiconductor. Due to flowing movement of the molten salt, at least two of an n-type semiconductor, a p-type semiconductor, an aluminum oxide, and a metallic aluminum may sometimes be mixed in the resultant product. In such a case, by making use of different densities (g/cm$^3$) of the mixed substances, the mixed substances can be collected separately. Specifically, the resultant product is formed into powder and is subjected to centrifugation, and the powdery substances mixed therein are collected separately. Consequently, the n-type semiconductor powder can be used as a raw material of an n-type aluminum oxide semiconductor, and the p-type semiconductor powder can be used as a raw material of a p-type aluminum oxide semiconductor.

By mixing (i) the raw material of the n-type aluminum oxide semiconductor or the raw material of the p-type aluminum oxide semiconductor with (ii) an aluminum oxide raw material having an insulating property, it is possible to adjust a carrier concentration in the mixed raw materials. Specifically, after the separating step S5, this method performs an adjusting step S6. The adjusting step S6 simultaneously sputters the n-type semiconductor layer 12 and a generally-used aluminum oxide to form a film. Alternatively, the n-type semiconductor powder collected through the centrifugation and generally-used aluminum oxide powder may be mixed together at a suitable ratio. By performing the film formation through the sputtering or the mixing through the centrifugation, an n-type aluminum oxide semiconductor whose carrier concentration is adjusted in a total quantity is formed. If the semiconductor layer formed by performing the film formation through the sputtering or the mixing through the centrifugation contains a small amount of p-type semiconductor, this does not matter. In addition, the p-type semiconductor layer 13 and a generally-used aluminum oxide are simultaneously sputtered to form a film. Alternatively, the p-type semiconductor powder collected through the centrifugation and generally-used aluminum oxide powder are mixed together at a suitable ratio. By performing the film formation through the sputtering or the mixing through the centrifugation, a p-type aluminum oxide semiconductor whose carrier concentration is adjusted in a total quantity is formed. If the semiconductor layer formed by performing the film formation through the sputtering or the mixing through the centrifugation contains a small amount of n-type semiconductor, this does not matter.

The p-type semiconductor layers 13 and the n-type semiconductor layers 12 shown in FIGS. 2 to 4 can be used as raw materials of an aluminum oxide semiconductor device and raw materials of a semiconductor battery electrode material. With a stacked structure including a combination of the p-type semiconductor layer 13 and the n-type semiconductor layer 12 shown in any of FIGS. 2 to 4, it is possible to provide various semiconductor devices, such as a diode, a transistor, and a thyristor. By using the p-type semiconductor layer 13 and the n-type semiconductor layer 12 shown in any of FIGS. 2 to 4 as a positive electrode material and a negative electrode material, respectively, it is possible to provide a semiconductor secondary battery.

[Estimate of Semiconductor Layer Formation Process]

The following describes a mechanism in which the n-type semiconductor layer 12 and the p-type semiconductor layer 13 are formed.

FIG. 5 shows a state where the base material 1, which is an insulator, is melted in response to laser emission. A portion of the base material 1 which portion has been subjected to laser emission is heated to a high temperature equal to or higher than the melting point (2072° C. in this case), so as to be turned into molten salt. As a result, when the switch 106 is closed, a current I flows due to a molten salt electrolysis reaction, as shown in FIG. 6.

When the current I flows due to the molten salt electrolysis reaction, an anode reaction expressed by the following formula (1) occurs in the anode 2 of the base material 1. Meanwhile, a cathode reaction expressed by the following formula (2) occurs in the cathode 3 of the base material 1.

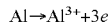  Formula (1)

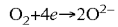  Formula (2)

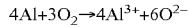  Formula (3)

At a temperature equal to or higher than the melting point, the molten salt electrolysis reaction occurs according to the formulae (1) and (2). This causes accumulation of $Al^{3+}$ and $O^{2-}$ in the base material 1, thereby leading to formation of a melted ion layer from which the n-type semiconductor layer 12 is formed and a melted ion layer from which the p-type semiconductor layer 13 is formed, as indicated by the formula (3).

When the laser emission ends, the temperature of the base material 1 decreases. The decrease in temperature does not take place at a perfectly uniform rate in the melted ion layer from which the n-type semiconductor layer 12 is formed and the melted ion layer from which the p-type semiconductor layer 13 is formed. Therefore, each melted ion layer has a solid-state portion and a liquid-state portion, and is partially solidified to yield $Al_2O_3$. The cathode reaction and the anode reaction shown in FIG. 7 still go on, for (a) the reason that a portion that remains molten is still ionized, (b) the reason that $Al_2O_3$, which is a solid, is an insulator at a room temperature but has electronic conductivity at a high temperature close to the melting point, or (c) both the reasons (a) and (b). In the n-type semiconductor layer 12, $O^{2-}$ ions become deficient and $Al^{3+}$ ions become excessive, so that the electric balance is lost. In order to maintain electroneutrality, a new donor level is formed in the n-type semiconductor layer 12. Meanwhile, in the p-type semiconductor layer 13, $Al^{3+}$ ions become deficient and $O^{2-}$ ions become excessive, and the electric balance is lost. In order to maintain electroneutrality, a new acceptor level is formed in the p-type semiconductor layer 13.

Furthermore, the n-type semiconductor layer 12 and the p-type semiconductor layer 13 shown in FIG. 8 are considered to be formed when the temperature of the base material 1 decreases to a room temperature. That is, the n-type semiconductor layer 12 thus formed is an oxygen-deficient or aluminum-excess n-type semiconductor. Meanwhile, the p-type semiconductor layer 13 thus formed is an aluminum-deficient or oxygen-excess p-type semiconductor. In an area between the n-type semiconductor layer 12 and the p-type semiconductor layer 13, an aluminum oxide layer 11 having an insulating property is formed.

In a case where the p-type semiconductor layer 13 and the n-type semiconductor layer 12 are in surface contact with each other, a pn junction is formed. At the junction portion, a depletion layer is created. The thickness of the depletion layer is determined based on the carrier concentration of the new donor level and the carrier concentration of the new acceptor level. From the result of the energy dispersive X-ray spectrometry (EDS) analysis on the cross sections of the n-type semiconductor layer 12 and the p-type semiconductor layer 13 and/or the like, the maximum carrier concentrations of the n-type semiconductor layer 12 and the p-type semiconductor layer 13 are assumed to be quite high ($10^{21}$ to $10^{23}$ per $cm^3$). The quite high carrier concentrations lead to creation of the depletion layer having a thickness of 1 nm or less, through which a tunneling current readily passes. In addition, the depletion layer is considered to attain a high electric conductivity, since electrons in the depletion layer are metalized.

As explained above, it is possible to form a semiconductor layer having a diameter of 20 μm or more. By collecting such semiconductor layers, it is possible to form a semiconductor layer having a diameter of 0.1 mm or more, thereby preparing a material of a practically-available device. Also, by preparing an n-type semiconductor powder and a p-type semiconductor powder and independently solidifying these powders, it is possible to form a practically-available device of a desired size and a negative electrode material and a positive electrode material for a semiconductor battery.

When the positive side and negative side of the direct-current power source 104 shown in FIGS. 1 and 5 are replaced with each other, the anode 2 is turned into a cathode and the cathode 3 is turned into an anode. As a result, a reaction reverse to that in Embodiment 1 occurs. That is, on the surface of the anode 2, a cathode reaction occurs and consequently a p-type semiconductor made of an oxygen-excess aluminum oxide is formed. Meanwhile, on the surface of the cathode 3, an anode reaction occurs and consequently an n-type semiconductor made of an oxygen-deficient aluminum oxide is formed.

Embodiment 2

Next, a semiconductor manufacturing method and a semiconductor manufacturing device in accordance with Embodiment 2 of the present invention are described below with reference to FIGS. 6 to 11. As drawings illustrating states of a base material and a semiconductor as well as a flowchart of the procedures of a semiconductor manufacturing method in accordance with Embodiment 2, FIGS. 6 to 9, which have been used to explain Embodiment 1, are used again. For convenience of explanation, parts having identical features in Embodiment 1 are given identical reference signs, and parts that are given identical reference signs may not be described again.

In Embodiment 1, the base material 1 is melted and bored by laser emission. On the contrary, in Embodiment 2, the base material 1 is not bored by laser emission. Rather, one principle surface of the base material 1 is planarly melted by laser emission. The method in accordance with Embodiment 2 causes a molten salt electrolysis reaction by causing a current to flow between an anode 2 and a cathode 3 that are in contact with the one principle surface having been melted.

[Raw Materials]

Similarly to Embodiment 1, Embodiment 2 adopts an aluminum oxide as a base material 1, which is a raw material used to form a semiconductor layer by a laser technique. Instead of the material that is generally called "alumina", the material of the base material 1 may alternatively be single-crystal sapphire having a melting point of 2040° C., a noncrystalline (amorphous) material, or a polycrystalline material. The base material 1 is plate-shaped. However, this is not limitative. Alternatively, the base material 1 may bar-shaped, line-shaped, or powdery, for example. The aluminum oxide used as the base material 1 preferably has a high purity. However, the purity of the aluminum oxide may be relatively low. For example, the base material 1 may be an aluminum oxide having a purity of 99.4% or more or 4N sapphire.

[Semiconductor Manufacturing Device]

Figure 10:
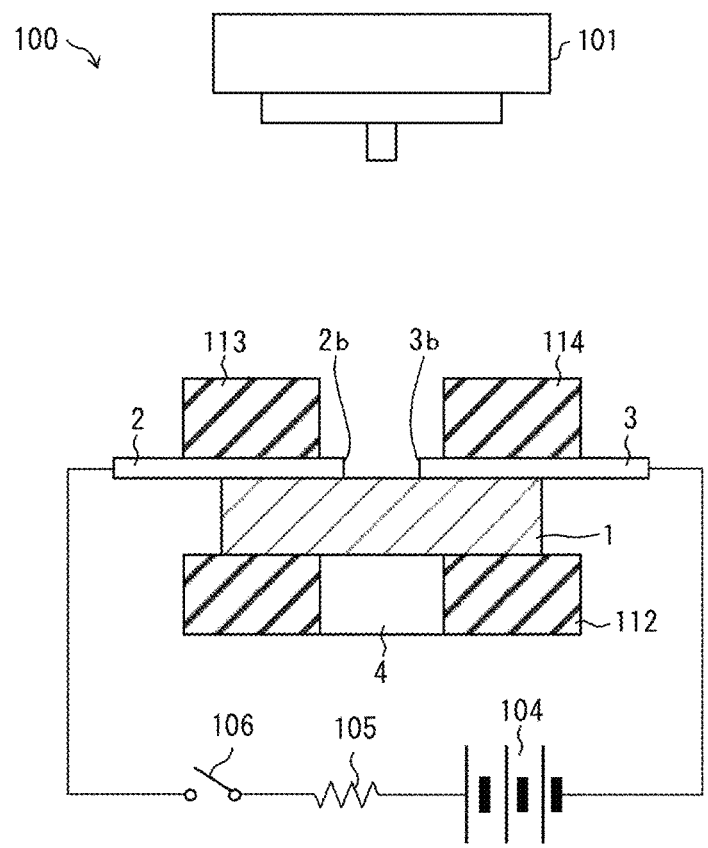
FIG. 10 is a view illustrating arrangement of a semiconductor manufacturing device and a cell in accordance with Embodiment 2.

As shown in FIG. 10, a semiconductor manufacturing device 100 in accordance with Embodiment 2 includes: a base material 1 disposed on a pressure plate 112 that is an insulator; an anode 2 and a cathode 3 disposed on the base material 1 so as to be apart from each other, the anode 2 and the cathode 3 each having a plate shape; a pressure plate 113 disposed on the anode 2, the pressure plate 113 being an insulator; and a pressure plate 114 disposed on the cathode 3, the pressure plate 114 being an insulator. In order to deal with a case where the base material 1 may be melted and bored by laser emission, a through-hole 4 is provided in a center part of the pressure plate 112. Although not shown in FIG. 10, the pressure plate 112, the pressure plate 113, the pressure plate 114, the anode 2, and the cathode 3 are fixed in order to avoid shifting of a positional relation therebetween. The semiconductor manufacturing device 100 further includes: a laser device 101 for emitting a laser beam to the base material 1; a direct-current power source 104 for applying a voltage between the anode 2 and the cathode 3; a current limiting resistor 105; and a switch 106.

The anode 2 is positioned in a part of an upper surface of the base material 1, the part being close to a first end (a left end in FIG. 10) of the base material 1. Meanwhile, the cathode 3 is positioned in a part of the upper surface of the base material 1, the part being close to a second end (a right end in FIG. 10) of the base material 1. The pressure plates 112 and 113 are provided with a jig for bringing the anode 2 into contact with the base material 1. The pressure plates 112 and 114 are provided with a jig for bringing the cathode 3 into contact with the base material 1.

[Anode]

The anode 2 is an aluminum plate. The shape of the anode 2 is not limited to a plate shape. Alternatively, the anode 2 may be bar-shape. Further alternatively, the anode 2 may be powder solidified into a plate shape or a bar shape. In a case where the anode 2 has a plate shape, the anode 2 preferably has a thickness of approximately 0.01 mm to 10 mm. When the base material 1 is melted in response to laser emission, a portion of the anode 2 which portion is in contact with the base material 1 is expected to be melted. With the anode 2 having a large thickness, the heat of the base material 1 having been melted is easily discharged to the outside through the anode 2. This can suppress or reduce an increase in temperature of a surface of the anode 2 which surface is in contact with the base material 1. Consequently, the anode 2 is not melted or is hardly melted.

However, it is more preferable that the anode 2 have a thickness of 0.2 mm or less. If the anode 2 is melted for long time, this causes breakdown of the structure functioning as the anode 2. Thus, it is necessary to set an appropriate laser emission condition(s).

Aluminum used as the anode 2 preferably has a high purity. However, the anode 2 may be made of an aluminum alloy containing another element, such as 1085 aluminum (99.85 mass % aluminum and other elements, e.g., Fe, Si).

[Cathode]

The cathode 3 is a platinum plate. Alternatively, the cathode 3 may be (1) a platinum group metal such as rhodium, (2) a platinum group oxide such as an iridium oxide, a palladium oxide, or a ruthenium oxide, or (3) a platinum group compound. Alternatively, the cathode 3 may be (1) an alloy containing the above-described platinum group metal, platinum group oxide, or platinum group compound or (2) a mixture containing the above-described platinum group metal, platinum group oxide, or platinum group compound. Further alternatively, the cathode 3 may be carbon. Platinum has a melting point of 1768° C. Platinum having a higher purity is preferable. However, platinum having a purity (99.9%) of commercially-available ones can sufficiently function as the cathode 3. The shape of the cathode 3 is not limited to a plate shape. Alternatively, the cathode 3 may be bar-shaped. Further alternatively, the cathode 3 may be powder solidified into a plate shape or a bar shape. In a case where the cathode 3 has a plate shape, the cathode 3 preferably has a thickness of approximately 0.01 mm to 10 mm.

In the case where platinum, which has a melting point lower than the melting point (2072° C.) of the base material 1, is adopted as the cathode 3, a portion of the cathode 3 which portion is in contact with the base material 1 is expected to be melted, when the base material 1 is melted in response to the laser emission. If the cathode 3 is melted for long time, this causes breakdown of the structure functioning as the cathode 3. Thus, it is necessary to set an appropriate laser emission condition(s).

When the laser device 101 emits a laser beam toward the base material 1, the laser beam passes through a space between the pressure plate 113 and the pressure plate 114 and a space between the anode 2 and the cathode 3 in this order, and thereafter hits the surface of the base material 1. A portion of the surface of the base material 1 which portion receives the laser beam is positioned at an intermediate location between an end 2b of the anode 2 and an end 3b of the cathode 3 when viewed from the laser device 101.

[Laser Device]

The laser device 101 is a device for emitting a laser beam to the base material 1. The laser beam emitted by the laser device 101 may be a laser beam emitted by a disk laser (wavelength: 1030 nm), a laser beam emitted by a fiber laser (wavelength: 1064 nm), a laser beam emitted by a YAG laser (wavelength: 1064 nm), a laser beam emitted by an excimer laser (the wavelength thereof varies depending on the type of gas used as a laser medium, and may be 193248 nm or 308351 nm, for example), a laser beam emitted by a carbon dioxide laser (wavelength: 1.6 μm), or a laser beam emitted by a semiconductor laser (the wavelength thereof varies depending on the element(s) from which the semiconductor is made, and may be within a range of 375 nm to 2000 nm, for example). The laser technique used in Embodiment 2 preferably employs any of the lasers described above. Among these, the carbon dioxide laser is suitable for an experiment of forming an aluminum oxide semiconductor layer in accordance with Embodiment 2.

[Method for Emitting Laser Beam to Sample]

Typically, it is possible to finely adjust the laser emission condition(s) by adjusting a setting of the laser device 101. Specifically, it is possible to appropriately set an emission energy (mJ), a pulse width (ms), a cycle (ms), an emission period (s), a focal point shifting amount (mm), and/or the like. The beam emitted from the disk laser, the fiber laser, or the like has a wavelength of approximately 1000 nm, which is within an infrared region. Thus, in principle, the light beam from such a laser would pass through the base material 1 and cannot perform processing.

Actually, however if the base material 1 has unevenness and/or dirt on its surface, the heat of the laser beam may be absorbed into some parts of the surface. In some cases, the parts may serve as starting points from which the heat is transmitted to their surroundings, so as to enable target processing (in Embodiment 2, melting of the base material 1). Here, in order to enable the processing to be performed in a stable manner, it is preferable to reliably secure the starting points by applying a quite small amount of graphite powder on a surface of the base material 1 in advance. In a case of adopting the carbon dioxide laser, it is not necessary to set the starting points, since a laser beam from the carbon dioxide laser would not pass through the base material 1 and is likely to planarly melt the base material 1.

Typically, the laser device 101 performs laser emission on a single base material 1 plural times. The position to be subjected to the laser emission is typically programmed in advance. The position to be subjected to the laser emission may be set by a galvano scanner including a mirror in a state where the base material 1 is fixed. Alternatively, the position may be set by moving the base material 1 over an XYZ stage in a state where the laser device 101 is fixed. Further alternatively, the position may be set by a combination of these techniques.

[Cell to be Subjected to Laser Emission]

In Embodiment 2, as shown in FIG. 10, the pressure plate 112 and the base material 1 are stacked in this order. In addition, the anode 2 and the pressure plate 113 are stacked in this order on the part of the base material 1 which part is close to the first end of the base material 1, and the cathode 3 and the pressure plate 114 are stacked in this order on the part of the base material 1 which part is close to the second end of the base material 1. Thus, a cell is given.

A distance between the end 2b of the anode 2 and the end 3b of the cathode 3 is adjusted to fall within a range of 0.05 mm to 5 mm. If the distance is equal to or less than 0.05 mm, the end 2b of the anode 2 or the end 3b of the cathode 3 may possibly be directly irradiated with the laser beam. Thus, the distance equal to or less than 0.05 mm is not preferable. Meanwhile, if the distance is greater than 5 mm, the heat generated in the base material 1 in response to laser emission is not sufficiently propagated to the end 2b of the anode 2 or the end 3b of the cathode 3 through the base material 1. Thus, the end 2b of the anode 2 or the end 3b of the cathode 3 would not be melted. Preferably, the distance is adjusted to fall within a range of 0.15 mm to 0.5 mm. It is important that a portion of the surface of the base material 1 which portion receives the laser beam be positioned at an intermediate location between the end 2b of the anode 2 and the end 3b of the cathode 3 when viewed from the laser device 101.

The direct-current power source 104, which is used to apply a voltage to the above-described cell, has a positive side connected to the anode 2 via the current limiting resistor 105 and the switch 106 and a negative side connected to the cathode 3. The switch 106 may be manually turned ON or OFF. Alternatively, in order to allow a current I to flow automatically when a molten salt electrolysis reaction occurs in response to laser emission, the switch 106 may be configured to be turned ON/OFF in sync with emission of a laser beam or to be turned ON before laser emission is performed.

[Semiconductor Manufacturing Method]

Figure 9:
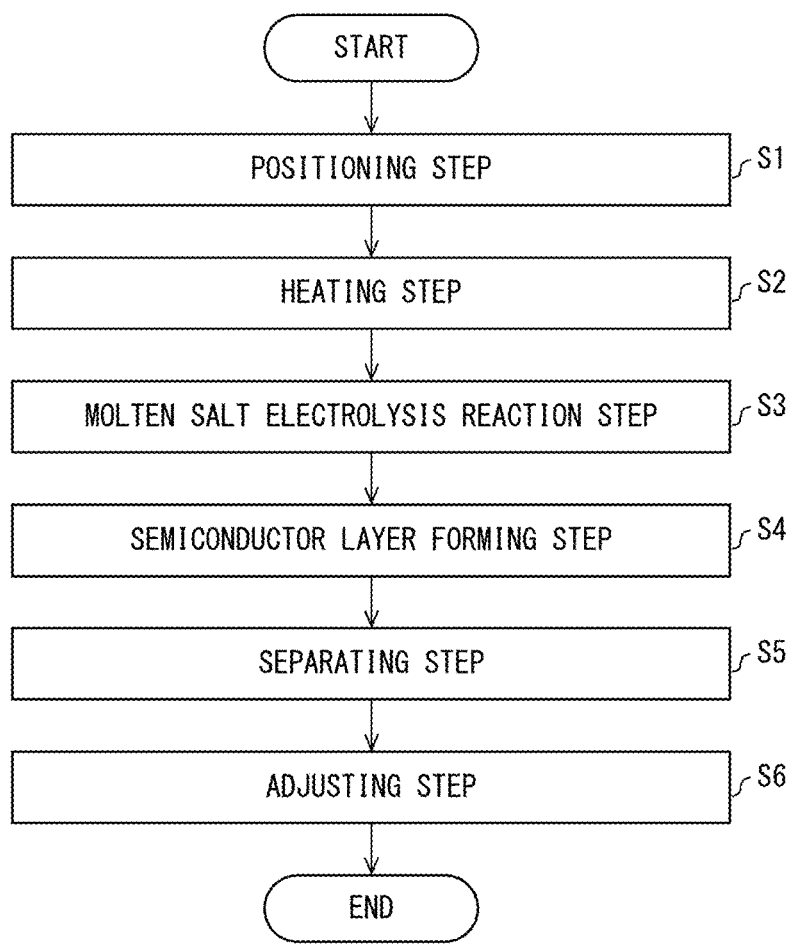
FIG. 9 is a flowchart illustrating procedures of a semiconductor manufacturing method in accordance with Embodiment 1.

Next, a method for manufacturing a semiconductor layer by use of the semiconductor manufacturing device 100 is described with reference to FIGS. 9 to 11. Assume that the works for this method are performed while the semiconductor manufacturing device 100 is under the atmosphere, i.e., in the air, and at a room temperature.

First, this method positions an anode 2 and a cathode 3 on one principle surface of a base material 1 (positioning step S1).

Next, this method heats the base material 1 to a temperature equal to or higher than a melting point (2072° C.) of the base material 1 to melt the base material 1, in a state where the anode 2 and the cathode 3 are in contact with the base material 1 (heating step S2). Heating of the base material 1 is performed by emission of a laser beam from the laser device 101 toward the base material 1, as shown in FIG. 11.

The following provides a specific explanation of the heating step S2. In the heating step S2, the switch 106 is first turned ON so that a voltage is applied between the anode 2 and the cathode 3. Note that, immediately after the voltage is applied between the anode 2 and the cathode 3, a current I would not flow through the base material 1, which is an insulator.

A magnitude of the voltage to be applied varies depending on the constituent material(s) of the above-described cell or the laser emission condition(s), but is to be set to fall within a range of 1 to 60 V. Also in Embodiment 2, for the purpose of suppressing or reducing an increase in speed of the molten salt electrolysis reaction, the current limiting resistor 105 is disposed in series to the direct-current power source 104 to prevent flowing of a current I of a certain value or higher. Thus, a coulomb amount in the current I flowing between the anode 2 and the cathode 3 is regulated.

Figure 11:
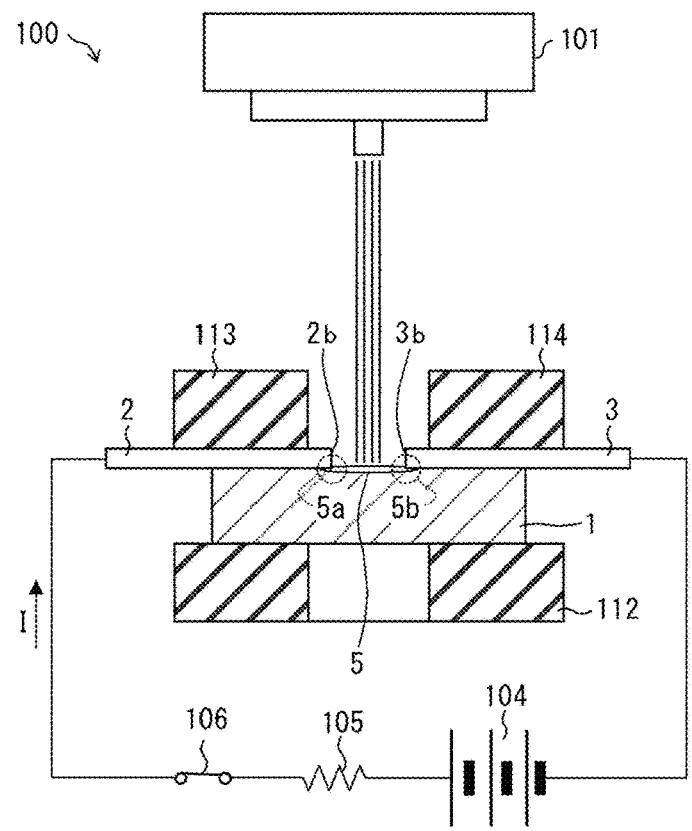
FIG. 11 is a view illustrating a method for forming an aluminum oxide semiconductor layer by laser emission in accordance with Embodiment 2.

Then, as shown in FIG. 11, the laser device 101 emits a laser beam toward the base material 1. The laser beam from the laser device 101 is emitted onto the portion of the surface of the base material 1, the portion being at the intermediate location between the end 2b of the anode 2 and the end 3b of the cathode 3.

After the heating step S2, this method causes the current I to flow between the anode 2 and the cathode 2 to cause a molten salt electrolysis reaction for the whole of a period in which the base material 1 is at least partially melted, as shown in FIG. 6 (molten salt electrolysis reaction step S3). The period of performing the molten salt electrolysis reaction step S3 may be only a part of the period in which the base material 1 is at least partially melted.

In the molten salt electrolysis reaction step S3, the base material 1 is heated to a temperature equal to or higher than the melting point, so as to be melted. The heat is propagated from the base material 1 to the end 2*b* of the anode 2 and the end 3*b* of the cathode 3. The heat transmitted from the base material 1 to the end 2*b* of the anode 2 melts a part of a surface of the end 2*b* of the anode 2. The melted surface of the base material 1 and the melted surface of the end 2*b* of the anode 2 come into close contact with each other. At a boundary between the melted surface of the base material 1 and the melted surface of the end 2*b* of the anode 2, an anode reaction advances.

Meanwhile, the heat propagated from the base material 1 to the end 3*b* of the cathode 3 melts a part of a surface of the end 3*b* of the cathode 3. The melted surface of the base material 1 and the melted surface of the end 3*b* of the cathode 3 come into close contact with each other. Oxygen in the air is supplied to a boundary between the melted surface of the base material 1 and the melted surface of the end 3*b* of the cathode 3, so that a cathode reaction advances in the boundary.

As a result of the above-described anode reaction and cathode reaction, a product 5 is formed in the base material 1. The product 5 has an end 5*a* close to the anode 2. The end 5*a* of the product 5 is in a state where oxygen ions are deficient or a state where aluminum ions are excess. Meanwhile, the product 5 has an end 5*b* close to the cathode 3. The end 5*b* of the product 5 is in a state where oxygen ions are excess or a state where aluminum ions are deficient. After the molten salt electrolysis reaction step S3 described above, this method cools the product 5 to form an n-type semiconductor layer 12 and a p-type semiconductor 13 (semiconductor layer forming step S4). Specifically, in the semiconductor layer forming step S4, the laser emission by the laser device 101 ends. When the laser emission ends, the temperature of product 5 decreases. Consequently, the product 5 is partially condensed and turned into a solid. As a result, as shown in FIG. 8, the n-type semiconductor layer 12 that is in a state where oxygen is deficient or a state where aluminum is excess is formed in the anode 2. Meanwhile, the p-type semiconductor layer 13 that is in a state where oxygen is excess or a state where aluminum is deficient is formed in the cathode 3.

The thicknesses of the n-type semiconductor layer 12 and p-type semiconductor 13 obtained by the semiconductor manufacturing method in accordance with Embodiment 2 can be changed by, e.g., the thickness of the base material 1, the laser emission condition(s), and/or the coulomb amount (current×time) in the current I flowing between the anode 2 and the cathode 3. For example, each of the n-type semiconductor layer 12 and the p-type semiconductor 13 may be formed to have a thickness in a wide range of 1 μm to 100 μm. In addition, by adjusting the electrolysis condition(s) for the molten electrolysis reaction, it is possible to form a pn junction in which the n-type semiconductor layer 12 and the p-type semiconductor 13 are in surface contact with each other.

When the positive side and negative side of the direct-current power source 104 shown in FIGS. 10 and 11 are replaced with each other, the anode 2 is turned into a cathode, and the cathode 3 is turned into an anode. As a result, a reaction reverse to that in Embodiment 2 occurs. That is, on the surface of the anode 2, a p-type semiconductor made of an oxygen-excess aluminum oxide is formed. Meanwhile, on the surface of the cathode 3, an n-type semiconductor made of an oxygen-deficient aluminum oxide is formed.

Referring back to FIG. 9, the following describes a manufacturing step performed after the semiconductor layer forming step S4. Also in Embodiment 2, a separating step S5 is performed after the semiconductor layer forming step S4. In the separating step S5, the pressure plate 113, the pressure plate 114, the anode 2, and the cathode 3 are first removed, so that the base material 1 in which the n-type semiconductor layer 12 and the p-type semiconductor layer 13 are formed is detached from the semiconductor manufacturing device 100. Then, the n-type semiconductor layer 12 and the p-type semiconductor layer 13 are separated from the base material 1 by cutting or sputtering, for example. The separation by sputtering is performed in the following manner. That is, in order to separate the n-type semiconductor layer 12, sputtering is performed with the p-type semiconductor layer 13 being masked. Meanwhile, in order to separate the p-type semiconductor layer 13, sputtering is performed with the n-type semiconductor layer 12 being masked. Alternatively, considering that the n-type semiconductor, the p-type semiconductor, the aluminum oxide, and the metallic aluminum mixed in the product 5 have different densities (g/cm$^3$), multiple products 5 may be collected and formed into powder. Then, the powdery products 5 may be subjected to centrifugation, and powdery substances mixed therein may be separately collected.

The n-type semiconductor and the p-type semiconductor thus separated are taken out. Then, the n-type semiconductor can be used as a raw material of an n-type aluminum oxide semiconductor, and the p-type semiconductor can be used as a raw material of a p-type aluminum oxide semiconductor. By mixing the raw material of the aluminum oxide semiconductor and the raw material of the aluminum oxide semiconductor, which has an insulating property, it is possible to adjust a carrier concentration.

Specifically, after the separating step S5, this method performs an adjusting step S6. The adjusting step S6 simultaneously sputters the n-type semiconductor layer 12 and a generally-used aluminum oxide to form a film, thereby forming an n-type aluminum oxide semiconductor layer having an adjusted carrier concentration. Alternatively, by mixing the n-type semiconductor powder collected through the centrifugation and generally-used aluminum oxide powder at a suitable ratio, an n-type aluminum oxide semiconductor whose carrier concentration is adjusted in a total quantity is formed. If the semiconductor layer formed by the film formation through the sputtering or the mixing through the centrifugation contains a small amount of p-type semiconductor, this does not matter. In addition, the p-type semiconductor layer 13 and a generally-used aluminum oxide are simultaneously sputtered to form a film. Alternatively, the p-type semiconductor powder collected through the centrifugation and generally-used aluminum oxide powder are mixed together at a suitable ratio. By performing the film formation through the sputtering or the mixing through the centrifugation, a p-type aluminum oxide semiconductor whose carrier concentration is adjusted in a total quantity is formed. If the semiconductor layer formed by the film formation through the sputtering or the mixing through the centrifugation contains a small amount of n-type semiconductor, this does not matter.

The p-type semiconductor layer 13 and n-type semiconductor layer 12 can be used as raw materials of an aluminum oxide semiconductor device and raw materials of a semiconductor battery electrode material. With a stacked structure including a combination of the p-type semiconductor layer 13 and the n-type semiconductor layer 12, it is possible to provide various semiconductor devices, such as a diode, a transistor, and a thyristor, as well as semiconductor batteries. In a case of using the n-type semiconductor powder and the p-type semiconductor powder, solidifying these powders can provide a practically-available device of a desired size and electrode materials for a semiconductor battery.

EXAMPLES AND COMPARATIVE EXAMPLES

The following explains examples and comparative examples with reference to FIG. 18.

Example 1

Example 1 is described with reference to FIGS. 1 to 9 and 18. In Example 1, used as the base material 1 was a 99.6% aluminum oxide plate (alumina plate) having a size of 50 mm×50 mm×0.5 mm. Used as the anode 2 was a 5N aluminum plate having a size of 50 mm×50 mm×0.5 mm. Used as the cathode 3 was a 4N platinum plate having a size of 50 mm×50 mm×0.1 mm and having a center part provided with nine small holes 3a each having a diameter of 1 mm and allowing a laser beam to pass therethrough.

Used as the pressure plate 102 on the anode 2 side was a SUS304 plate having a size of 80 mm×80 mm×10 mm. Used as the pressure plate 103 on the cathode 3 side was a SUS304 plate having a size of 80 mm×80 mm×10 mm and having a center part provided with nine through-holes 103a each having a diameter of 1 mm and allowing a laser beam to pass therethrough.

As shown in FIG. 1, the pressure plate 102, the anode 2, the base material 1, the cathode 3, and the perforated pressure plate 103 were stacked in this order, so as to provide a cell.

For this structure, the nine small holes 3a of the cathode 3 and the nine through-holes 103a of the pressure plate 103 were respectively aligned to each other with an error margin of 0.1 mm or less, so that a laser beam can hit the base material 1. The pressure plate 102 and the perforated pressure plate 103 were fixed with loads being applied thereto with clamps, for example.

For this structure, insulating sheets made of Teflon (registered trademark) having a thickness of 1 mm were provided to all of pinching parts of the clamps, so as to electrically insulate the pressure plate 102 and the perforated pressure plate 103 from each other. Note that the material of the insulating sheet may be changed as needed.

Used as the laser device 101 was TruDisk10003 (a disk laser available from TRUMPF). Used as the direct-current power source 104 was PMX500-0.1A (available from Kikusui Electronics Corporation). Used as an oscilloscope for measuring changes in voltage and current was DS-5412A (available from Iwatsu Electric Co., Ltd).

First, a laser beam was emitted to a first one of the nine through-holes 103a in a state where the switch 106 shown in FIG. 1 was OFF and under the conditions of a laser emission output 500 W, a spot size φ0.3 mm, an emission period 500 ms, and a focal point shifting amount ±0 mm. It was confirmed in advance that an aluminum oxide was favorably melted under the laser emission conditions.

Next, immediately after the switch 106 was turned ON in the manner shown in FIG. 5, a laser beam was emitted to a second one of the nine through-holes 103a in a state where the direct-current power source 104 was in a 60 V constant voltage mode and under the conditions same as above. The current limiting resistor 105 was set at 10Ω. After confirming that the current I flowed in the laser emission period, the switch 106 was turned OFF. Consequently, a product having a diameter of approximately 1.2 mm was obtained.

Figure 12:
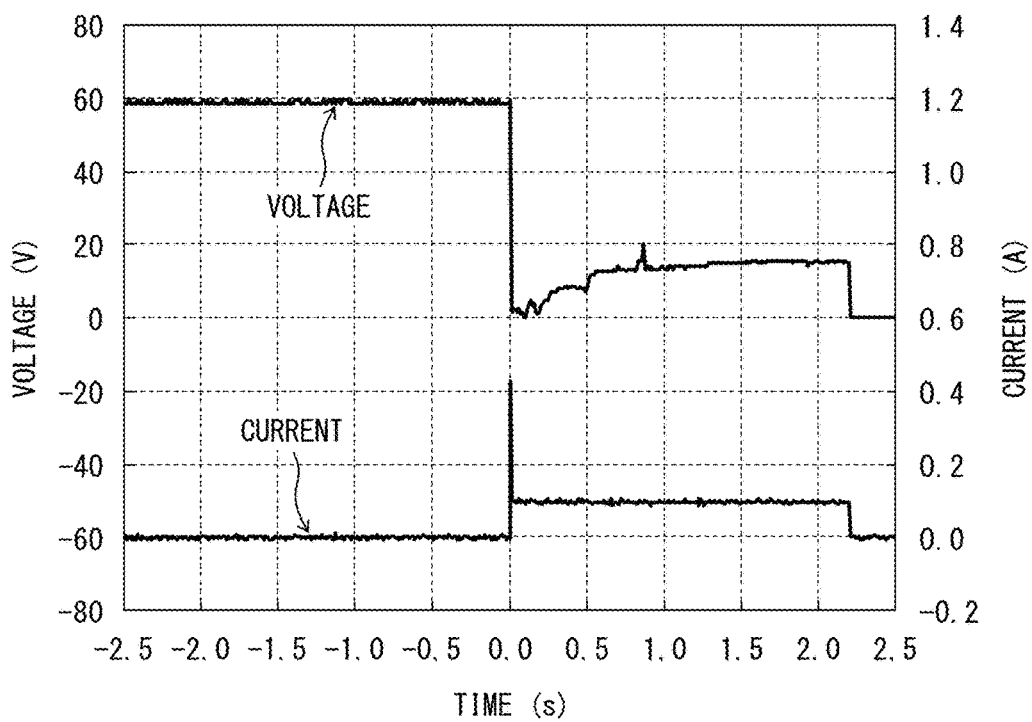
FIG. 12 shows a result of oscilloscope observation of changes in voltage and current occurred when laser emission was conducted in Example 1.

FIG. 12 shows a result of oscilloscope observation of changes in voltage and current occurred when laser emission was conducted. A part of the horizontal axis which part is more rightward than 0.0 second indicates a period of time after start of the laser emission, whereas a part of the horizontal axis which part is more leftward than 0.0 second indicates a period of time before the start of the laser emission. The vertical axis on the left indicates a voltage, whereas the vertical axis on the right indicates a current.

As shown in FIG. 12, the voltage was approximately 60 V before the laser emission (the part more leftward than 0.0 second). However, immediately after the laser emission, the voltage dropped greatly. Thereafter, the voltage had a value in a range of 0 V to 8 V until 0.5 seconds. However, after 0.5 seconds had passed, the voltage rose and was maintained at a value in a range of 1.2 V to 1.6 V during a period from 0.5 seconds to 2.2 seconds. After 2.2 seconds had passed, the voltage was substantially 0 V.

Meanwhile, the current reached its peak immediately after the laser emission, and then was changed to 0.1 A. Thereafter, the current was maintained at 0.1 A until 2.2 seconds. After 2.2 seconds had passed, the current sharply dropped to 0.0 A.

Figure 7:
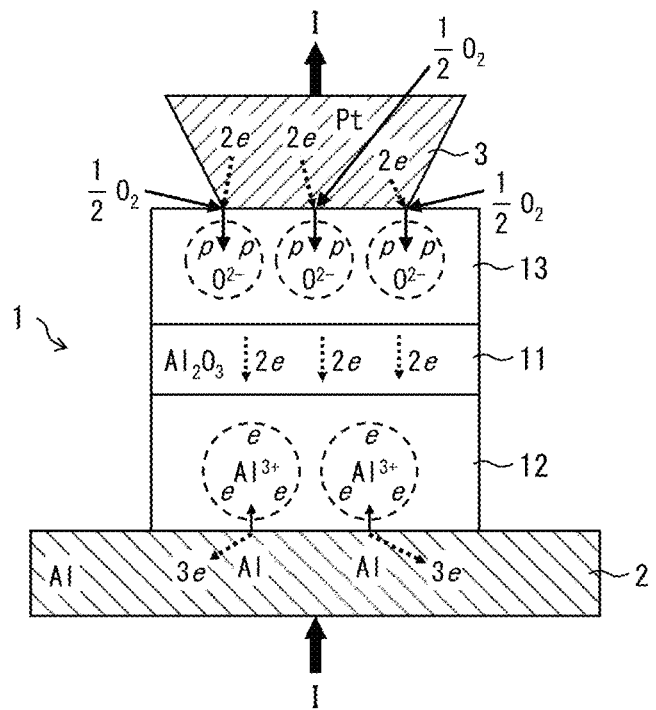
FIG. 7 is a view illustrating a state in accordance with Embodiment 1 in which a semiconductor layer is being formed and a temperature is close to the melting point.

From this, it is considered that the anode reaction and the cathode reaction shown in FIG. 6 occurred in a period from 0.0 second to 1.0 second and the p-type semiconductor layer 13 and the n-type semiconductor layer 12 shown in FIG. 7 were formed in a period from 1.0 second to 2.2 seconds.

Figure 13:
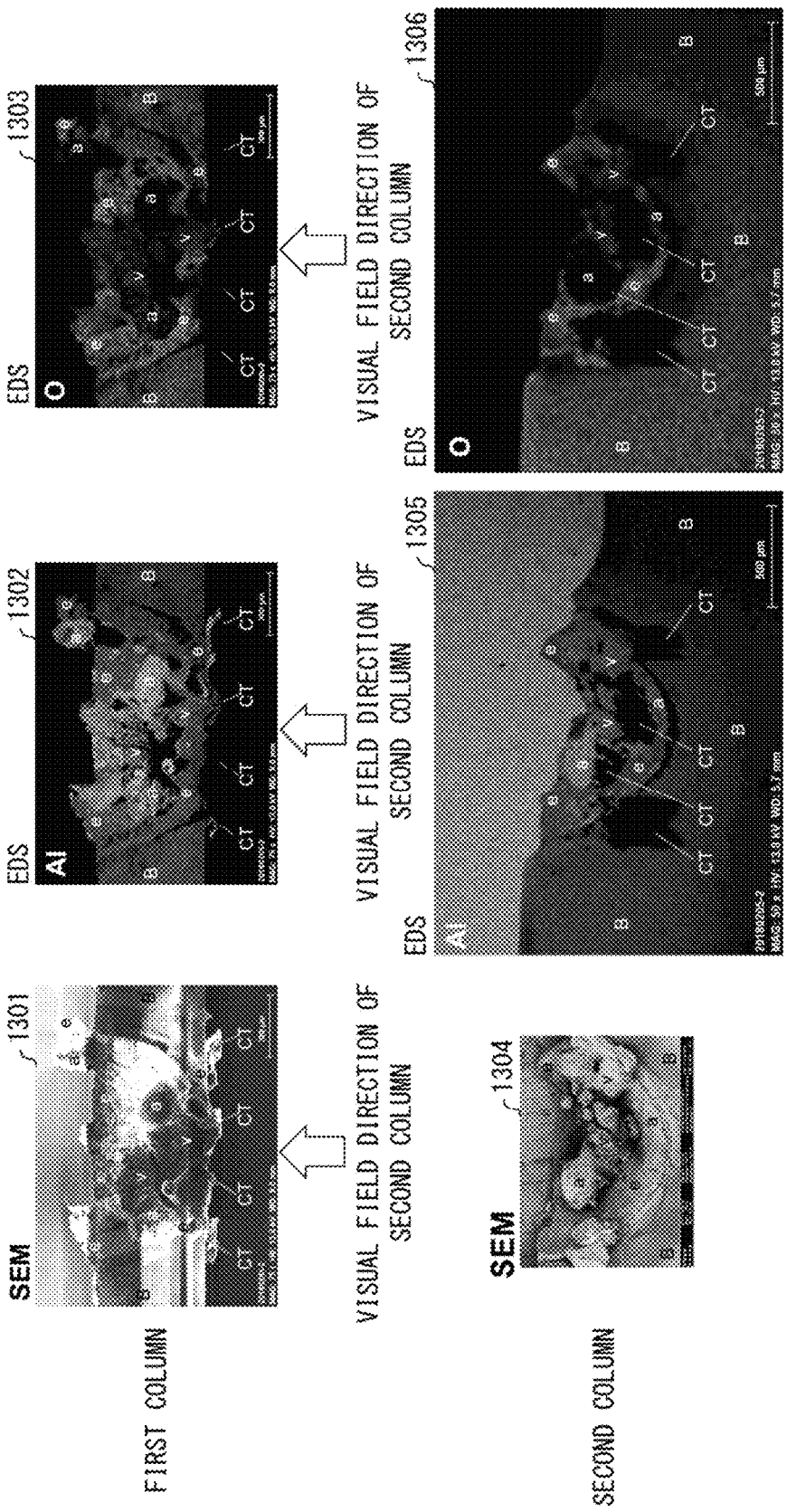
FIG. 13 shows results of SEM observation and EDS elemental analysis performed in Example 1.

The cell was disassembled, and the base material 1 was taken out. Then, a sample formed as a result of laser emission to the second one of the nine through-holes 103a and application of the current I was subjected to SEM observation and EDS elemental analysis. Aluminum was partially adhered to a side of the sample, the side being farther from the laser device 101 (the side being closer to the anode 2). Aluminum thus adhered was completely removed. Next, the formed sample was taken out. Then, the base material 1 was manually split into two such that the cross section of the second one of the through-holes 103a was divided into two equal parts. FIG. 13 shows a cross section of one of the two split pieces of the sample and the results of SEM observation and EDS elemental analysis performed thereon from the anode 12 side. Three views in an upper part (the first column) of FIG. 13 include an image 1301 that is an SEM image, an image 1302 that is an elemental mapping image of Al taken in the same part as in the image 1301, and an image 1303 that is an elemental mapping image of O taken in the same part as in the image 1301.

Three views in a lower part (the second column) of FIG. 13 include an image 1304 that is an SEM image, an image 1305 that is an elemental mapping image of Al taken in the same part as in the image 1304, and an image 1306 that is an elemental mapping image of O taken in the same part as in the image 1304. However, the image 1304 in the second column was captured at a different timing from the timing at which the elemental mapping images were captured, and therefore does not include a CT (carbon tape adhesive) included in all other images.

In FIG. 13, the parts indicated by "B" correspond to bulks. In the parts indicated by "a", Al was strongly detected but almost no O was detected. The parts indicated by "a" are considered to be aluminum. In the parts indicated by "v", Al was detected as strongly as in the bulks but O was detected at a lower intensity than in the bulks. The parts indicated by "v" are considered to be an n-type semiconductor in which oxygen is deficient. In the parts indicated by "e", Al was detected as strongly as in the bulks but O was detected at a higher intensity than in the bulks. The parts indicated by "e" are considered to be a p-type semiconductor in which oxygen is excess. The parts indicated by "CT" correspond to sites where the carbon tape adhesive existed, as described above.

From these results, it is shown that the p-type semiconductor and the n-type semiconductor were formed by the method in accordance with the present invention. However, the parts corresponding to the n-type semiconductor indicated by "v" and the parts corresponding to the p-type semiconductors indicated by "e" existed irregularly, and the n-type semiconductor and p-type semiconductor were not in the form of distinct layers as those shown in FIGS. 2 to 4. This is assumed to have happened because the energy of the laser beam emitted under the above conditions was too large. In order to produce the semiconductor in the form of distinct layers, it is necessary to optimize the structures of the anode and cathode, the laser emission condition(s), the coulomb amount in the current to flow, and/or the like. The n-type semiconductor was an oxygen-deficient aluminum oxide, and the p-type semiconductor was an oxygen-excess aluminum oxide. It was confirmed by electron diffraction that each of these semiconductors was an amorphous material or an amorphous material containing a small amount of polycrystal.

Example 2

Next, Example 2 is described with reference to FIGS. 10 to 18. In Example 2, used as the base material 1 was a 99.6% aluminum oxide plate (alumina plate) having a size of 25 mm×25 mm×0.5 mm. Used as the anode 2 was an aluminum plate being made of 1085 aluminum material (99.85 mass % aluminum and other elements, e.g., Fe, Si) and having a size of 20 mm×40 mm×0.18 mm. Used as the cathode 3 was a 4N platinum band plate having a size of 1.5 mm×30 mm×0.2 mm.

As shown in FIG. 10, the base material 1 was placed on the pressure plate 112, and the anode 2 and the pressure plate 113 were stacked in this order on a part of an upper surface of the base material 1, the part being close to a first end (a left end in FIG. 10) of the base material 1. The cathode 3 and the pressure plate 114 were stacked in this order on a part of the upper surface of the base material 1, the part being close to a second end (the right end in FIG. 10) of the base material 1. These materials were stacked in such a manner that an end 2b of the anode 2 and an end 3b of the cathode 3 were arranged in parallel to each other and were separated from each other by a space of 0.20 mm. These materials were stacked also in such a manner that a laser beam could pass through an intermediate part of the space between the end 2b and the end 3b so as to hit the base material 1.

The pressure plates 112, 113, and 114 were fixed with SUS screws while the base material 1 and the anode 2 were sandwiched by the pressure plates 112 and 113 and the base material 1 and the cathode 3 were sandwiched by the pressure plates 112 and 114. The fixing was performed in such a manner as to avoid electrical contact between the anode 2 and the cathode 3.

Used as the laser device 101 was a carbon dioxide laser SPL2305-E400 available from Shibuya Corporation. Used as the direct-current power source 104 was PMX500-0.1A available from Kikusui Electronics Corporation. Used as an oscilloscope for measuring changes in voltage and current was DS-5412A (available from Iwatsu Electric Co., Ltd).

First, a laser beam was emitted to the base material 1 without the anode 2 and cathode 3 attached thereto, so as to determine the laser emission conditions under which the base material 1 was melted in a favorable form. As a result, it was confirmed that the emission conditions of an emitted pulse energy 100 mJ, a pulse width 0.1 ms, a cycle 10 ms, an emission period 0.5 s, and a focal point shifting amount 4.0 mm could give a melting spot having a diameter of approximately 0.7 m on the surface of the base material 1. Thus, it was confirmed that the above emission conditions could melt the aluminum oxide favorably.

Next, as shown in FIG. 11, the anode 2 and the cathode 3 were attached to the base material 1, the direct-current power source 104 was brought into a 60 V constant voltage mode, and the switch 106 was turned ON. Immediately after this, laser emission was performed under the above-described conditions. The current limiting resistor 105 was set at 0Ω. After confirming that the current I flowed in the laser emission period, the switch 106 was turned OFF.

Figure 14:
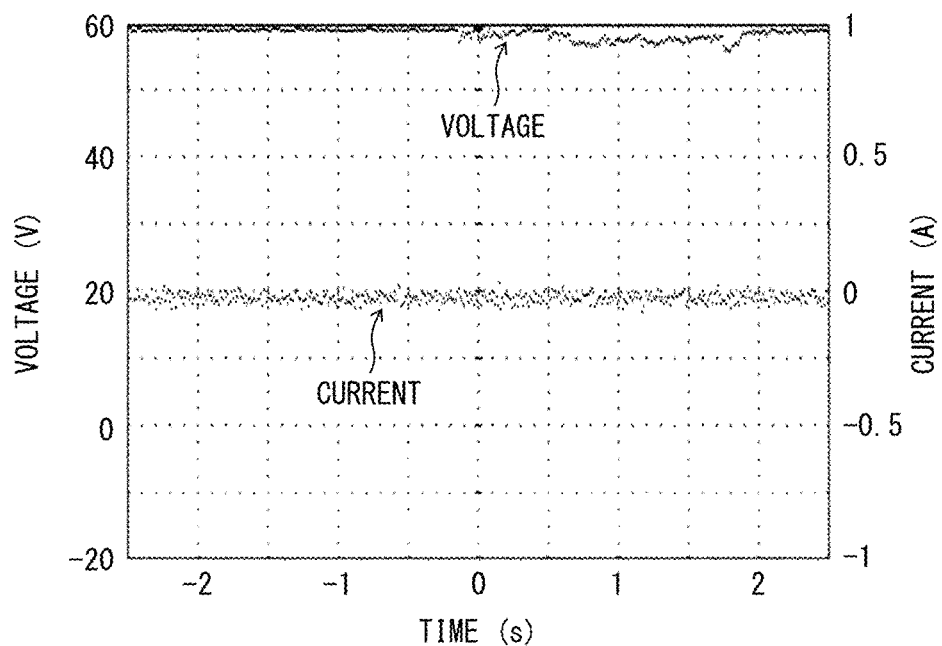
FIG. 14 shows a result of oscilloscope observation of changes in voltage and current occurred when laser emission was conducted in Example 2.

FIG. 14 shows results of oscilloscope observation on a voltage and a current measured at this time. A part of the horizontal axis which part is more rightward than 0.0 second indicates a period of time after start of the laser emission, whereas a part of the horizontal axis which part is more leftward than 0.0 second indicates a period of time before the start of the laser emission. The vertical axis on the left indicates a voltage, whereas the vertical axis on the right indicates a current. In the measurement shown in FIG. 14, a trigger level of the oscilloscope was set at 58 V or less. Therefore, the oscilloscope was triggered after 0.2 seconds had elapsed since the laser emission. Thus, an actual period of time elapsed since the laser emission can be obtained by adding 0.2 seconds to the reading on the time axis.

As shown in FIG. 14, the voltage was maintained at approximately 60 V before the laser emission (corresponding to the part more leftward than 0.0 second). However, in response to the laser emission, the voltage slightly dropped, and became unstable continuously for approximately 2 seconds. Thereafter, the voltage was restored to 60 V.

Meanwhile, the current could not be measured almost at all. With the oscilloscope, the current was buried in noise and could not be detected. However, by directly reading an ammeter, a current of approximately 4 mA was measured in a period from 0.0 second to 2.0 seconds, and a current of 0 mA was measured in a period after 2 seconds. In this experiment, a current of approximately 0.1 A was expected to flow. However, the current actually flowed was approximately 4 mA, and a semiconductor formed was little.

The reason why the flowed current was smaller than expected is considered as below. That is, relative to the melted part of the base material 1, the anode 2 and the cathode 3 were greater in size and in heat capacity. Thus, the heat of the melted part of the base material 1 generated in response to the laser emission was likely to be discharged after being propagated to the anode 2 and the cathode 3 through the end 2b of the anode 2 and the end 3b of the cathode 3. This might have led to a phenomenon that the end 2b and the end 3b had little parts heated enough to cause a molten salt electrolysis reaction or a phenomenon that a period of time in which the temperature increased was quite short.

Figure 15:
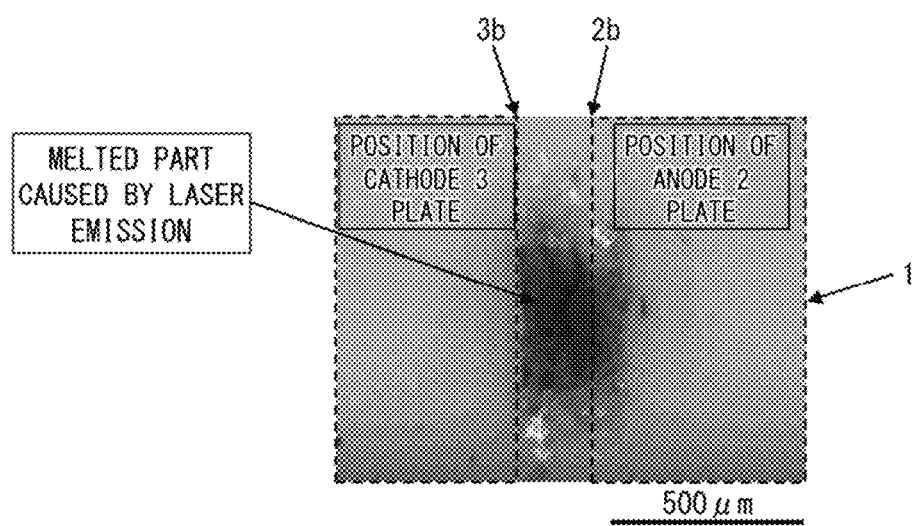
FIG. 15 shows an image of a surface of a sample obtained in Example 2, the image being captured with an optical microscope.

FIG. 15 shows an image of a surface of a sample thus obtained, the image being captured with an optical microscope. A dark portion in a center part of the base material 1 is the melted part generated as a result of the laser emission. A part surrounded by the broken lines on the left side corresponds to the position of the cathode 3, whereas a part surrounded by the broken lines on the right side corresponds to the position of the anode 2. In FIG. 15, the position of the end 3b of the cathode 3 and the position of the end 2b of the anode 2 are shown. A distance between the ends 3b and 2b was 0.2 mm. The melted part had a size of approximately 0.7 mm when measured in a top-bottom direction in FIG. 15. This was almost the same as that observed in the above-described case where the laser beam was emitted to the base material 1 without the anode 2 and the cathode 3 attached thereto.

Meanwhile, the melted part had a size of approximately 0.3 mm when measured in a left-right direction. On the cathode 3 side (left side), the left line of the melted part almost coincided with the line defining the end 3b. Meanwhile, on the anode 2 side (right side), the right line of the melted part protruded rightward from the end 2b by approximately 0.1 mm.

Figure 16:
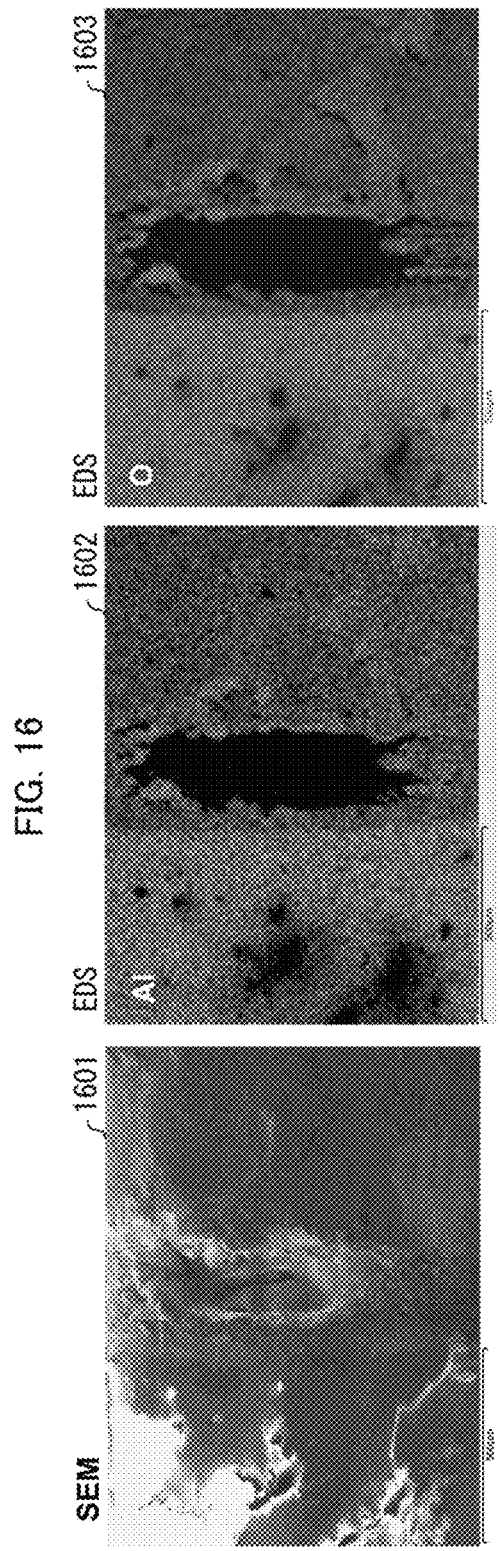
FIG. 16 shows results of SEM observation and EDS elemental analysis performed in Example 2.

FIG. 16 shows results of SEM observation and EDS elemental analysis on the sample shown in FIG. 15. An image 1601 is an SEM image, an image 1602 is an elemental mapping image of Al, and an image 1603 is an elemental mapping image of O.

Figure 17:
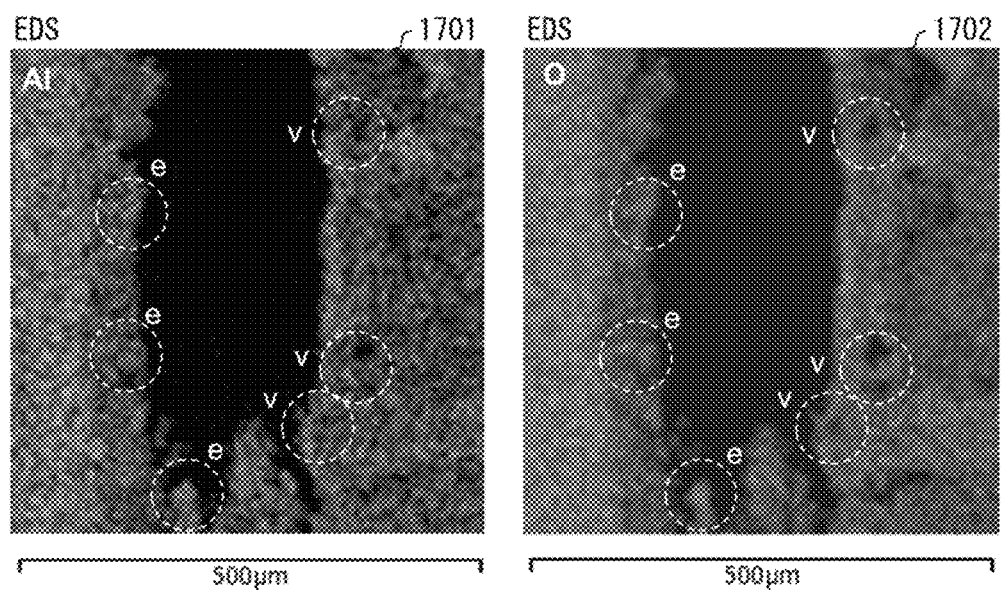
FIG. 17 shows a result of EDS elemental analysis performed in Example 2.

From FIG. 16, it is difficult to see a difference between intensities of Al and O. Therefore, only the image 1602 and the image 1603 are taken out from FIG. 16, and enlarged versions thereof are shown in FIG. 17. An image 1701 corresponds to the enlarged view of the image 1602, and an image 1702 corresponds to the enlarged view of the image 1603.

As shown in FIG. 17, the broken-line circles were given to the same locations in the images 1701 and 1702. The parts surrounded by the three circles indicated by "e" in the image 1701 are compared with those in the image 1702. According to the comparison, the intensity of O was slightly higher than that of Al. This shows that an oxygen-excess p-type semiconductor was formed. Referring to FIGS. 15 and 16, the p-type semiconductor was formed along the end 3b of the cathode 3.

Meanwhile, the parts surrounded by the three circles indicated by "v" in the image 1701 are compared to those in the image 1702. According to the comparison, the intensity of O was slightly lower than that of Al. This shows that an oxygen-deficient n-type semiconductor was formed. Referring to FIGS. 15 and 16, the n-type semiconductor was formed in a space between a location close to the end 2b of the anode 2 and the base material 1.

The yield of the product in Example 2 was quite smaller than that of Example 1. This happened for the following reason. That is, while the coulomb amount in the laser emission in Example 1 was 0.1 A×2.2 s, the coulomb amount in the laser emission in Example 2 was 4 mA×2 s. In short, this happened because the coulomb amount in Example 2 was one-twenty-seventh of the coulomb amount in Example 1. In order to deal with this, the anode 2 and the cathode 3 may be reduced in size by forming the anode 2 and the cathode 3 in a bar-shape, rather than in a plate-shape. This can reduce dissipation of heat generated in response to laser emission, thereby increasing the coulomb amount in Example 2 so as to increase the yield of the semiconductor.

The n-type semiconductor was an oxygen-deficient aluminum oxide, and the p-type semiconductor was an oxygen-excess aluminum oxide. It was confirmed by electron diffraction that each of these semiconductors was an amorphous material or an amorphous material containing a small amount of polycrystal. Therefore, to be more precise, the n-type semiconductor was an "oxygen-deficient amorphous aluminum oxide", and the p-type semiconductor was an "oxygen-excess amorphous aluminum oxide".

Comparative Example 1

The following explains Comparative Example 1, which was conducted for analysis on the results of Examples 1 and 2 described above. Comparative Example 1 did not perform the molten salt electrolysis reaction step S3. In this point, Comparative Example 1 differs from Examples 1 and 2.

In Comparative Example 1, a product having a diameter of 1.2 mm was obtained, similarly to Example 1. The product thus obtained was subjected to EDS elemental analysis. An aluminum metal was partially adhered to a side of the product, the side being farther from the laser device 101 (the side being closer to the anode 2). The aluminum metal thus adhered was completely removed. Then, a part of the sample which part was assumed to be a surface of the base material 1 was subjected to EDS analysis.

As a result, Al and O were detected as elements. For reference, a part of the base material 1 which part was not subjected to laser emission by the laser device 101 was analyzed for Al and O. As a result, no difference was found in intensities of Al and O. This means that Comparative Example 1 could not form a semiconductor layer.

COMPARATIVE EXAMPLE 2

Next, the following explains Comparative Example 2. Comparative Example 2 did not perform laser emission by the laser device 101. In this point, Comparative Example 2 differs from Examples 1

Comparative Example 2 used, as the base material 1, a 5N aluminum plate having a size of 24 mm×24 mm and a thickness of 0.1 mm. Comparative Example 2 used, as a target material, 5N aluminum Al ($\varphi$76×6 mm thickness) available from Furuuchi Chemical Corporation. Under the conditions of Ar+$O_2$ gas and a total pressure of 0.4 Pa, sputtering was performed for approximately 40 minutes. Consequently, an aluminum oxide film of approximately 30 nm was formed on the aluminum plate. A sputtering device used was SPC-350 available from Nichiden Anelva Corporation.

Next, with use of scanning probe microscope JSPM-5200 available from Japan Electron Optics Laboratory and a probe (available from Budgetsensors), a product was formed by a spark technique. An anode 2 was the aluminum plate, and a cathode 3 was the probe. A voltage to be applied was set to 60 V. Then, the voltage was applied at a scanning rate of approximately 10 V/s. When the applied voltage reached approximately 20 V, a spark occurred. As a result, in Comparative Example 2, a quite small product having a diameter of approximately 1 μm was produced.

From the product, a cross-section sample was prepared with focused ion beam (FIB). The cross-section sample was then subjected to TEM observation and EDS elemental analysis. As a result, Al and O were detected as elements. In a part of the product which part is closer to the surface (cathode), O was found in a large amount and Al was found in a small amount. Thus, it is considered that a p-type semiconductor layer was formed therein. Meanwhile, in a part of the product which part is closer to the aluminum (anode), O was found in a small amount and Al was found in a large amount. Thus, it is considered that an n-type semiconductor layer was formed therein.

Although an aluminum oxide layer 11, which is an insulator, was interposed between the p-type semiconductor layer 13 and the n-type semiconductor layer 12, there was a part where the p-type semiconductor layer 13 and the n-type semiconductor layer 12 were in direct contact with each other. It is considered that a pn junction occurred in this part. The n-type semiconductor was an oxygen-deficient amorphous aluminum oxide, and the p-type semiconductor was an oxygen-excess amorphous aluminum oxide.

FIG. 18 collectively shows the results of Example 1, Example 2, Comparative Example 1, and Comparative Example 2 described above. In each of Example 1 and Example 2, a target p-type semiconductor layer 13 and a target n-type semiconductor layer 12 could be obtained by laser emission to the base material 1 and a molten salt electrolysis reaction caused by current application.

On the other hand, in a case where laser emission by the laser device 101 was conducted but a molten salt electrolysis reaction did not take place as in Comparative Example 1, a semiconductor layer could not be obtained. Meanwhile, in a case where a product was obtained by the spark technique as in Comparative Example 2, although the product achieved a semiconductor property, the product was small in size, specifically, approximately 1 μm in diameter. Thus, a large semiconductor layer could not be obtained.

[Summary]

A semiconductor manufacturing method in accordance with an embodiment of the present invention includes: a positioning step S1 of positioning an anode 2 in a first end of a base material 1 and a cathode 3 in a second end of the base material 1, the base material 1 containing an aluminum oxide, the anode 2 causing an oxidation reaction, the cathode 3 causing a reduction reaction; a heating step S2 of heating the base material 1 to melt the base material 1 in a state where the anode 2 is in contact with the first end of the base material 1 and the cathode 3 is in contact with the second end of the base material 1; a molten salt electrolysis reaction step S3 of causing a current I to flow between the anode 2 and the cathode 3 to cause a molten salt electrolysis reaction for a whole of or a part of a period in which the base material 1 is at least partially melted; and after the molten salt electrolysis reaction step S3, a semiconductor layer forming step S4 of cooling the base material 1 to form a p-type semiconductor layer 13 and an n-type semiconductor layer 12.

The heating step S2 heats the base material 1 by a laser beam, and the laser beam includes at least one of a light beam from a YAG laser, a light beam from a disk laser, a light beam from a fiber laser, a light beam from an excimer laser, a light beam from a carbon dioxide laser, and a light beam from a semiconductor laser.

With the above configuration, it is possible to effectively heat the base material 1.

The anode 2 is made of aluminum, and the cathode 3 is made of platinum.

The anode 2 is made of platinum, and the cathode is made of aluminum.

The base material 1 is formed of a powdery material or a plate-shaped material.

The semiconductor manufacturing method further includes: a separating step S5 of separating only the p-type semiconductor layer 13 and the n-type semiconductor layer 12 formed in the semiconductor layer forming step S4; and an adjusting step S6 of simultaneously sputtering the p-type semiconductor layer 13 and/or the n-type semiconductor layer 12 separated in the separating step S5 and a generally-used aluminum oxide to form an aluminum oxide semiconductor layer having an adjusted carrier concentration.

A semiconductor manufacturing device 100 used in the semiconductor manufacturing method includes: a pressure plate 102 configured to bring an anode 2 into contact with a first end of a base material 1 and a perforated pressure plate 103 configured to bring a cathode 3 into contact with a second end of the base material 1, the anode 2 causing an oxidation reaction, the cathode 3 causing a reduction reaction; a direct-current power source 104 configured to apply a voltage between the anode 2 and the cathode 3; and a laser device 101 serving as a light source for emitting a laser beam to the base material 1.

The present invention is not limited to the embodiments and examples, but can be altered by a skilled person in the art within the scope of the claims. The present invention also encompasses, in its technical scope, any embodiment derived by combining technical means disclosed in differing embodiments.

REFERENCE SIGNS LIST

1 Base material
2 Anode
2b End
3 Cathode
3a Small hole
3b End
4 Through-hole
5 Product
5a End
5b End
11 Aluminum oxide layer
12 n-type semiconductor layer (n-type aluminum oxide semiconductor layer)
13 p-type semiconductor layer (p-type aluminum oxide semiconductor layer)
100 Semiconductor manufacturing device
101 Laser device (light source)
102 Pressure plate
103 Perforated pressure plate
103a Through-hole
104 Direct-current power source
105 Electric current limiting resistor
106 Switch
112 Pressure plate
113 Pressure plate
114 Pressure plate
S1 Positioning step
S2 Heating step
S3 Molten salt electrolysis reaction step
S4 Semiconductor layer forming step
S5 Separating step
S6 Adjusting step

The invention claimed is:

1. A semiconductor manufacturing method comprising the steps of:
  (a) positioning an anode in a first end of a base material and a cathode in a second end of the base material, the base material containing an aluminum oxide, the anode causing an oxidation reaction, the cathode causing a reduction reaction;
  (b) heating the base material to melt the base material in a state where the anode is in contact with the first end of the base material and the cathode is in contact with the second end of the base material;
  (c) causing a current to flow between the anode and the cathode to cause a molten salt electrolysis reaction for a whole of or a part of a period in which the base material is at least partially melted; and after the step (c), (d) cooling the base material to form a p-type aluminum oxide semiconductor layer and/or an n-type aluminum oxide semiconductor layer.

2. The semiconductor manufacturing method as set forth in claim 1, wherein:
   in the step (b), the base material is heated by a laser beam, and
   the laser beam includes at least one from the group of a light beam from a yttrium aluminum garnet laser, a light beam from a disk laser, a light beam from a fiber laser, a light beam from an excimer laser, a light beam from a carbon dioxide laser, and a light beam from a semiconductor laser.

3. The semiconductor manufacturing method as set forth in claim 1, wherein:
   the anode is made of aluminum or an aluminum alloy, and
   the cathode is made of platinum or a metal whose surface is at least partially covered with platinum.

4. The semiconductor manufacturing method as set forth in claim 1, wherein:
   the anode is made of platinum or a metal whose surface is at least partially covered with platinum, and
   the cathode is made of aluminum or an aluminum alloy.

5. The semiconductor manufacturing method as set forth in claim 1, wherein the base material is formed of a powdery material or a plate-shaped material.

6. The semiconductor manufacturing method as set forth in claim 1, further comprising the steps of:
   (e) separating only the p-type aluminum oxide semiconductor layer and/or the n-type aluminum oxide semiconductor layer formed in the semiconductor layer forming step; and
   (f) simultaneously sputtering the p-type aluminum oxide semiconductor layer and/or the n-type aluminum oxide semiconductor layer separated in the separating step and an aluminum oxide to form an aluminum oxide semiconductor layer having an adjusted carrier concentration.

7. The semiconductor manufacturing method recited in claim 1, comprising using a semiconductor manufacturing device including:
   a jig configured to bring the anode into contact with the first end of the base material and to bring the cathode into contact with the second end of the base material;
   a direct-current power source configured to apply a voltage between the anode and the cathode; and
   a light source configured to emit a laser beam to the base material.

* * * * *